(12) United States Patent
Hyakudai et al.

(10) Patent No.: US 11,743,024 B2
(45) Date of Patent: Aug. 29, 2023

(54) COMMUNICATION DEVICE AND COMMUNICATION SYSTEM

(71) Applicant: Sony Semiconductor Solutions Corporation, Kanagawa (JP)

(72) Inventors: Toshihisa Hyakudai, San Diego, CA (US); Junya Yamada, Kanagawa (JP); Satoshi Ota, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/536,751

(22) Filed: Nov. 29, 2021

(65) Prior Publication Data

US 2022/0255716 A1 Aug. 11, 2022

Related U.S. Application Data

(60) Provisional application No. 63/148,022, filed on Feb. 10, 2021.

(51) Int. Cl.
| | |
|---|---|
| H04B 3/00 | (2006.01) |
| H04L 25/00 | (2006.01) |
| H04L 7/00 | (2006.01) |
| H03L 7/18 | (2006.01) |
| H04L 7/06 | (2006.01) |
| H04L 69/22 | (2022.01) |

(52) U.S. Cl.
CPC .............. H04L 7/0008 (2013.01); H03L 7/18 (2013.01); H04L 7/06 (2013.01); H04L 69/22 (2013.01)

(58) Field of Classification Search
CPC ......... H04L 7/0008; H04L 7/06; H04L 69/22; H04L 1/0084; H04L 1/0057; H03L 7/18; H04H 20/88; H04N 21/4305; H04N 19/89

USPC ........ 375/355, 354, 362, 371, 373, 257, 258
See application file for complete search history.

(56) References Cited

U.S. PATENT DOCUMENTS

| | | | |
|---|---|---|---|
| 6,914,637 B1* | 7/2005 | Wolf ..................... | H04N 19/89 348/476 |
| 8,780,939 B2* | 7/2014 | Bafra .................... | H04L 1/0084 370/476 |
| 2001/0044713 A1* | 11/2001 | Lokhoff ................ | H04H 20/88 |

(Continued)

FOREIGN PATENT DOCUMENTS

JP 2011239011 A 11/2011

*Primary Examiner* — Phuong Phu
(74) *Attorney, Agent, or Firm* — Michael Best & Friedrich LLP

(57) ABSTRACT

Communication devices and systems with correct regeneration of an audio signal are disclosed. In one example, a communication device measures a number of predetermined reference clocks included in one cycle of a frequency divided signal, on the basis of an audio master clock having a frequency obtained by multiplying a frequency of a sampling clock to sample an audio signal, a frequency division ratio of a frequency divided signal of the audio master clock, and a predetermined reference clock. A packet generator generates a packet including information including the measured number, a bit width of serial data (SD) conforming to an Inter-IC Sound (I2S) standard, the frequency of the sampling clock, a frequency division ratio of the frequency divided signal to the audio master clock, a frequency ratio of the frequency of the audio master clock to the frequency of the sampling clock, and the SD.

17 Claims, 27 Drawing Sheets

(56) References Cited

U.S. PATENT DOCUMENTS

| | | | |
|---|---|---|---|
| 2004/0080671 A1* | 4/2004 | Siemens | H04L 1/0057 348/E5.002 |
| 2013/0322439 A1* | 12/2013 | Verhallen | G06F 13/385 370/389 |
| 2014/0143587 A1* | 5/2014 | Rajapakse | H04N 21/4305 713/600 |
| 2021/0173611 A1* | 6/2021 | Chen | G06F 1/04 |

* cited by examiner

FIG. 2A
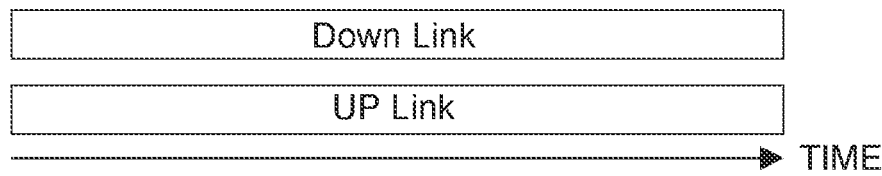
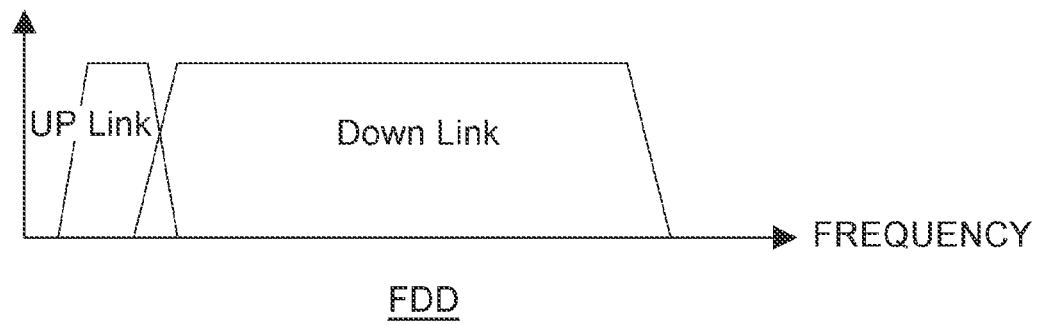
FDD
FIG. 2B
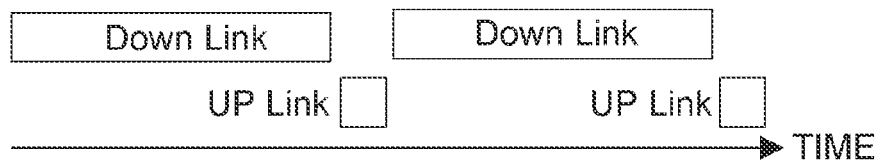
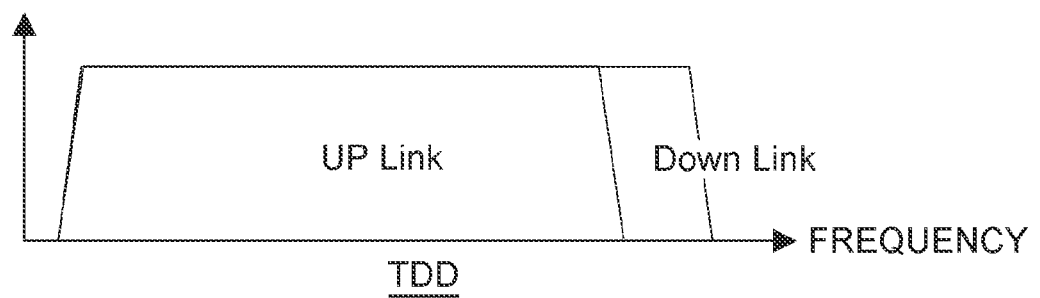
TDD

*FIG. 8*

| TxREFCK | [MHz] | 250 | |
|---|---|---|---|
| fs | [kHz] | 44.1 | 48.0 |
| K | | 512 | |
| MCK (K*fs) | [MHz] | 22.5792 | 24.576 |
| N | | 7056 | 1536 |
| (Expected) PMC result value (M) | | 78125 | 15625 |

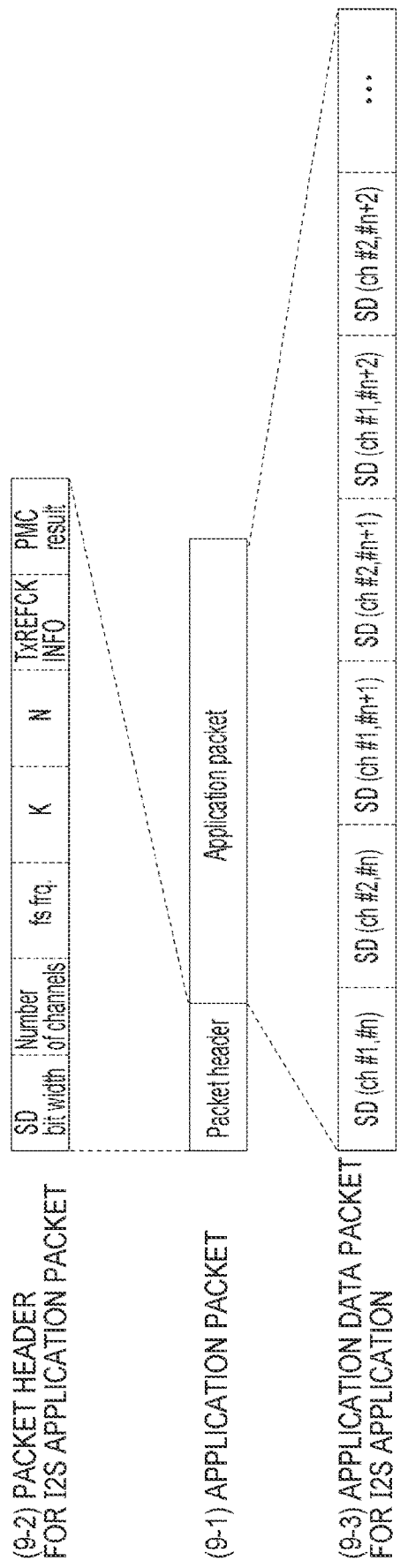

FIG. 10A

I2S header

| Byte | Bit(s) | Name | Description |
|---|---|---|---|
| 1 | 7:5 | I2S frame format | 000: I2S format<br>001: Left justified<br>010: Rigth Justified<br>011-111: reserved |
| 1 | 4:3 | I2S data bit width | 00: 16bit<br>01: 18bit<br>10: 20bit<br>11: 24bit |
| 1 | 2:0 | number of stereo | 3bit integer.<br>THIS NUMBER INDICATES NUMBER OF COMMUNICATION CHANNELS. IF THIS NUMBER IS 1, IT MEANS THAT ONE PIECE OF STEREO (L×R) DATA IS TRANSMITTED.<br>IF THIS NUMBER IS 4, IT MEANS THAT FOUR PIECES OF STEREO DATA ARE TRANSMITTED. |
| 2 | 7:5 | fs (sampling frequency) | 000: 44.1kHz<br>001: 48kHz<br>010: 96kHz<br>011: 192kHz |
| 2 | 4:0 | K (multiplier to make the audio master clock) | 0x00: 32<br>0x01: 64<br>0x02: 128<br>0x03: 256<br>0x04: 512<br>0x05: 1024 |
| 3 | 7:5 | reserved | |
| 3 | 4:0 | N[12:8] | 13bit integer<br>DIVISION RATIO N (ex 24.576MHz, 22.5792MHz) OF AUDIO MASTER FREQUENCY Fm<br>THIS DIVISION RATIO DEPENDS ON Fm.<br>IF fm is 24.576MHz, then N is 1536.<br>IF fm is 22.5792MHz, then N is 7056 |
| 4 | 7:0 | N[7:0] | |
| 5 | 7 | reserved | |
| 5 | 6:4 | TxREFCK INFO | 000: 1GHz<br>001: 500MHz<br>010: 250MHz<br>011: reserved<br>100: 125MHz<br>101: 62.5MHz<br>110: 31.25MHz<br>111: else |
| 5 | 3:2 | reserved | |
| 5 | 1:0 | PMC result [17:16] | 18bit integer<br>THIS NUMBER IS COUNT VALUE OF fm/N(SEC) BY TxREFCK (250MHz).<br>IDEALLY, WHEN fm=24.576MHz AND N=1536, PMC RESULT VALUE = 15625.<br>WHEN fm=22.5792MHz AND N=7056, PMC RESULT VALUE = 78125.<br>RECEPTION DEVICE CAN RESTORE fm BY PMC RESULT VALUE AND N. |
| 6 | 7:0 | PMC result[15:8] | |
| 7 | 7:0 | PMC result[7:0] | |

FIG. 10B

I2S data

| Byte | Bit(s) | Name | Description |
|---|---|---|---|
| m+n-1+p | 7:0 | I2S L data [15:8], ch #n, sample #p | data format for 16bit data width. L channel of the #n stereo data. |
| m+1+n-1+p | 7:0 | I2S L data [7:0], ch #n, sample #p | |
| m+2+n-1+p | 7:0 | I2S R data [15:8], ch #n, sample #p | data format for 16bit data width. R channel of the #n stereo data. |
| m+3+n-1+p | 7:0 | I2S R data [7:0], ch #n, sample #p | |

| Byte | Bit(s) | Name | Description |
|---|---|---|---|
| m+n-1+p | 7:0 | I2S L data [23:16], ch #n, sample #p | DATA FORMAT WITH 18, 20, OR 24bit data width. IF DATA WIDTH IS 18 OR 20bits, BIT FIELD LARGER THAN DATA WIDTH IS FILLED WITH "0". L channel of the #n stereo data. |
| m+1+n-1+p | 7:0 | I2S L data [15:8], ch #n, sample #p | |
| m+2+n-1+p | 7:0 | I2S L data [7:0], ch #n, sample #p | |
| m+3+n-1+p | 7:0 | I2S R data [23:16], ch #n, sample #p | DATA FORMAT WITH 18, 20, OR 24bit data width. IF DATA WIDTH IS 18 OR 20bits, BIT FIELD LARGER THAN DATA WIDTH IS FILLED WITH "0". R channel of the #n stereo data. |
| m+4+n-1+p | 7:0 | I2S R data [15:8], ch #n, sample #p | |
| m+5+n-1+p | 7:0 | I2S R data [7:0], ch #n, sample #p | |

I2S data

| Byte | Bit(s) | Name | Description |
|---|---|---|---|
| m | 7:0 | I2S data field | |

CRC

| Byte | Bit(s) | Name | Description |
|---|---|---|---|
| k | 7:0 | CRC 32 [31:24] | CRC 32 CHECKS FROM GPIO HEADER TO END OF GPIO DATA IN EACH GPIO PAYLOAD. CYCLIC REDUNDANCY CHECK USES POLYNOMIAL RING 0xF4ACFB13. |
| k+1 | 7:0 | CRC 32 [23:16] | |
| k+2 | 7:0 | CRC 32 [15:8] | |
| k+3 | 7:0 | CRC 32 [7:0] | |

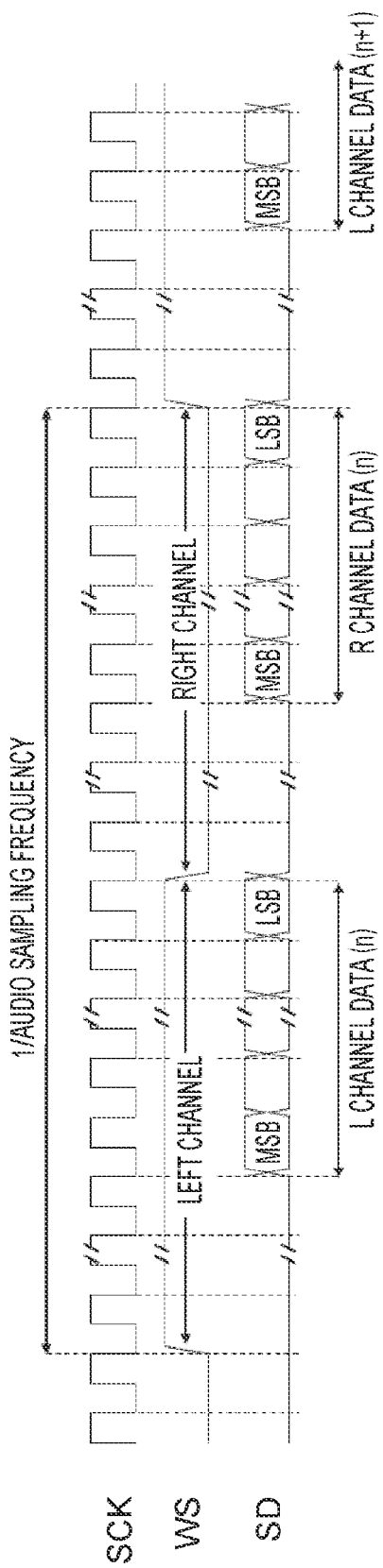

FIG. 14

| TxREFCK | [MHz] | 250 |
|---|---|---|
| fs | [kHz] | 50 |
| K | | 512 |
| MCK (K*fs) | [MHz] | 25.6 |
| N | | 64 |
| (Expected) PMC result value (M) | | 625 |

FIG. 22A

I2S header

| Byte | Bit(s) | Name | Description |
|---|---|---|---|
| 1 | 7:5 | I2S frame format | 000: I2S format<br>001: Left justified<br>010: Rigth Justified<br>011-111: reserved |
| 1 | 4:3 | I2S data bit width | 00: 16bit<br>01: 18bit<br>10: 20bit<br>11: 24bit |
| 1 | 2:0 | number of stereo. | 3bit integer.<br>THIS NUMBER INDICATES NUMBER OF COMMUNICATION CHANNELS. IF THIS NUMBER IS 1, IT MEANS THAT ONE PIECE OF STEREO (L×R) DATA IS TRANSMITTED. IF THIS NUMBER IS 4, IT MEANS THAT FOUR PIECES OF STEREO DATA ARE TRANSMITTED. |
| 2 | 7:5 | Fs (samling frequency) | 000: 44.1kHz<br>001: 48kHz<br>010: 96kHz<br>011: 192kHz |
| 2 | 4:0 | reserved | |
| 3 | 7:0 | TS1[23:16] | 24bit integer |
| 4 | 7:0 | TS1[15:8] | THIS IS PTB TIME OF RISING EDGE OF WS SIGNAL IN FIRST SD AMONG PLURALITY OF PIECES OF SD IN PACKET. |
| 5 | 7:0 | TS1[7:0] | |
| 6 | 7:0 | TS2[23:16] | 24bit integer |
| 7 | 7:0 | TS2[15:8] | THIS IS PTB TIME OF RISING EDGE OF LAST WS SIGNAL AMONG PLURALITY OF PIECES OF SD IN PACKET. |
| 8 | 7:0 | TS2[7:0] | |
| 9 | 7:0 | number of samples[15:8] | 16bit integer |
| 10 | 7:0 | number of samples[7:0] | IT REPRESENTS NUMBER OF I2S DATA SAMPLES TRANSMITTED IN THIS PACKET |

FIG. 22B

I2S data

| Byte | Bit(s) | Name | Description |
|---|---|---|---|
| m+0+n·i+p | 7:0 | I2S L data [15:8], ch #n, sample #p | data format for 16bit data width. L channel of the #n stereo data. |
| m+1+n·i+p | 7:0 | I2S L data [7:0], ch #n, sample #p | |
| m+2+n·i+p | 7:0 | I2S R data [15:8], ch #n, sample #p | data format for 16bit data width. R channel of the #n stereo data. |
| m+3+n·i+p | 7:0 | I2S R data [7:0], ch #n, sample #p | |

| Byte | Bit(s) | Name | Description |
|---|---|---|---|
| m+0+n·i+p | 7:0 | I2S L data [23:16], ch #n, sample #p | DATA FORMAT WITH 18, 20, OR 24bit data width. IF DATA WIDTH IS 18 OR 20bits, BIT FIELD LARGER THAN DATA WIDTH IS FILLED WITH "0". |
| m+1+n·i+p | 7:0 | I2S L data [15:8], ch #n, sample #p | |
| m+2+n·i+p | 7:0 | I2S L data [7:0], ch #n, sample #p | L channel of the #n stereo data. |
| m+3+n·i+p | 7:0 | I2S R data [23:16], ch #n, sample #p | DATA FORMAT WITH 18, 20, OR 24bit data width. IF DATA WIDTH IS 18 OR 20bits, BIT FIELD LARGER THAN DATA WIDTH IS FILLED WITH "0". |
| m+4+n·i+p | 7:0 | I2S R data [15:8], ch #n, sample #p | |
| m+5+n·i+p | 7:0 | I2S R data [7:0], ch #n, sample #p | R channel of the #n stereo data. |

I2S data

| Byte | Bit(s) | Name | Description |
|---|---|---|---|
| m | 7:0 | I2S data field | |

CRC

| Byte | Bit(s) | Name | Description |
|---|---|---|---|
| k | 7:0 | CRC 32 [31:24] | CRC 32 CHECKS FROM GPIO HEADER TO END OF GPIO DATA IN EACH GPIO PAYLOAD. CYCLIC REDUNDANCY CHECK USES POLYNOMIAL RING 0xF4ACFB13. |
| k+1 | 7:0 | CRC 32 [23:16] | |
| k+2 | 7:0 | CRC 32 [15:8] | |
| k+3 | 7:0 | CRC 32 [7:0] | |

COMMUNICATION DEVICE AND COMMUNICATION SYSTEM

CROSS REFERENCE TO RELATED APPLICATIONS

This application claims the benefit of U.S. Priority Patent Application No. 63/148,022 filed on Feb. 10, 2021, the entire contents of which are incorporated herein by reference.

TECHNICAL FIELD

The present disclosure relates to a communication device and a communication system.

BACKGROUND ART

A technique for performing high-speed serial communication between SerDes for Master and SerDes for Slave has been proposed (see PTL 1).

When an audio signal is transmitted between two SerDes, it is conceivable to transmit a signal conforming to the Inter-IC Sound (I2S) protocol.

CITATION LIST

Patent Literature

[PTL 1]
JP 2011-239011A

SUMMARY

Technical Problem

However, a signal conforming to the I2S protocol is asynchronous with a signal transmitted between two SerDes, and a frequency band is also different.

Furthermore, the frequency of a sampling clock of the audio signal is not necessarily one, and the frequency of the sampling clock may be different depending on the audio source. It may be necessary to transmit these audio signals between the two SerDes so that they can be played correctly.

Therefore, the present disclosure provides a communication device and a communication system capable of transmitting an audio signal between communication devices that perform signal transmission asynchronously with the audio signal, and correctly regenerating the audio signal.

Solution to Problem

According to the present disclosure, there is provided a communication device including:

a measurement unit that measures a number of the predetermined reference clocks included in one cycle of the frequency divided signal, on the basis of an audio master clock having a frequency obtained by multiplying a frequency of a sampling clock to sample an audio signal, a frequency division ratio of a frequency divided signal of the audio master clock, and a predetermined reference clock; and a packet generator that generates a packet including information including the number measured by the measurement unit, a bit width of serial data (SD) conforming to an Inter-IC Sound (I2S) standard, the frequency of the sampling clock, a frequency division ratio of the frequency divided signal to the audio master clock, a frequency ratio of the frequency of the audio master clock to the frequency of the sampling clock, and the SD.

The packet generated by the packet generator may include a header section and a data section, and the header section may include the number measured by the measurement unit, the bit width of the SD, the frequency of the sampling clock, the frequency division ratio, and the frequency ratio, and the data section may include a plurality of pieces of the SD.

The header section may include the bit width of the SD, a number of channels of the SD, the frequency of the sampling clock, the frequency division ratio of the frequency divided signal to the audio master clock, the frequency ratio of the frequency of the audio master clock to the frequency of the sampling clock, the frequency of the reference clock, and the number measured by the measurement unit.

The data section may include pieces of the SD corresponding to the number of channels and a number of samples.

The communication device may further include:

a physical layer clock generator that generates a clock commonly used in physical layers of both the communication device and the communication partner device; and a divider that divides the clock generated by the physical layer clock generator to generate the reference clock.

A frequency of the clock generated by the physical layer clock generator may be 250 megahertz (MHz).

The frequency of the audio master clock may be 25.6 MHz, and the frequency of the sampling clock may be 50 kilohertz (kHz).

The sampling clock and the audio master clock may be asynchronous with the reference clock.

The sampling clock and the audio master clock may be synchronized with the reference clock.

The communication device may further include a precision time base (PTB) clock generator that generates a PTB clock used to generate time stamp information used in common with a communication partner device, in which the reference clock may be the PTB clock.

The audio master clock may be synchronized with the PTB clock.

A frequency of the PTB clock may be 250 MHz.

According to the present disclosure, there is provided a communication device including:

a measurement unit that receives a word select (WS) signal conforming to an Inter-IC Sound (I2S) standard, and that measures first timing information indicating a timing of a logical change of the WS signal in a first piece of serial data (SD) among a plurality of pieces of the SD included in one packet transmitted to a communication partner device, and second timing information indicating a timing of a logical change of the WS signal in a last piece of the SD among the plurality of pieces of the SD, on the basis of a predetermined reference clock used in common with the communication partner device; and a packet generator that generates the packet including a bit width of the SD, a frequency of a sampling clock to sample an audio signal, the first timing information, the second timing information, a number of pieces of the SD included in the one packet, and the SD.

The packet generator may generate the packet further including information on a number of channels of the SD.

According to the present disclosure, there is provided a communication device including:

a restoration unit that receives a packet transmitted from a communication partner device and restores, from the packet, serial data (SD) conforming to an Inter-IC Sound (I2S) standard, a bit width of the SD, a frequency of a sampling clock to sample an audio signal, a frequency ratio of a frequency of an audio master clock to the frequency of the sampling clock, a number of predetermined first reference clocks included in one cycle of a frequency divided signal of the audio master clock, the frequency of the sampling clock, and a frequency division ratio of the frequency divided signal to the audio master clock;

an audio master clock regenerator that regenerates the audio master clock on the basis of a number of the first reference clocks, a frequency of the first reference clock, and the frequency division ratio; and a serial clock (SCK) regenerator that regenerates an SCK on the basis of bit width information of the SD, the frequency ratio, and the audio master clock.

The communication device may further include:

a clock regeneration circuit that generates a second reference clock synchronized with a signal change of the SD on the basis of the packet; and a frequency ratio calculator that calculates a frequency ratio between a frequency of the first reference clock and a frequency of the second reference clock, in which the audio master clock regenerator may regenerate the audio master clock on the basis of the number of the first reference clocks, frequency information of the first reference clock, the frequency division ratio, and the frequency ratio calculated by the frequency ratio calculator.

The communication device may further include a precision time base (PTB) clock generator that generates a PTB clock used to generate time stamp information used in common with the communication partner device, in which the first reference clock may be the PTB clock.

According to the present disclosure, there is provided a communication device including:

a restoration unit that receives packets transmitted from a communication partner device and restores, from the packets, serial data (SD) conforming to an Inter-IC Sound (I2S) standard, bit width information of the SD, frequency information of serial clock (SCK), first timing information indicating a timing when a word select (WS) signal first changes logically from the WS signal included in one of the packets, second timing information indicating a timing when the WS signal last changes logically from the WS signal included in one of the packets, and a number of pieces of the SD included in one of the packets;

a clock generator that generates a reference clock used in common with the communication partner device;

a WS signal regenerator that regenerates the WS signal on the basis of the first timing information, the second timing information, the number of pieces of the SD, and the reference clock;

an audio master clock regenerator that multiplies a frequency of the WS signal regenerated by the WS signal regenerator and regenerates an audio master clock; and an SCK regenerator that regenerates the SCK on the basis of the WS signal regenerated by the WS signal regenerator and the bit width information of the SD.

The communication device may further include a precision time base (PTB) clock generator that generates a PTB clock used to generate time stamp information used in common with a communication partner device, in which the reference clock may be the PTB clock.

The packet may be transmitted within a period allocated by time division duplex (TDD).

According to the present disclosure, there is provided a communication system including:

a first communication device; and a second communication device that performs serial communication with the first communication device, in which the first communication device includes a measurement unit that measures, on the basis of an audio master clock having a frequency obtained by multiplying a frequency of a sampling clock to sample an audio signal, a frequency division ratio of a frequency divided signal of the audio master clock, and a predetermined reference clock, a number of the predetermined reference clocks included in one cycle of the frequency divided signal, and a packet generator that generates a packet including information including the number measured by the measurement unit, a bit width of serial data (SD) conforming to an Inter-IC Sound (I2S) standard, the frequency of the sampling clock, a frequency division ratio to the audio master clock of the frequency divided signal, a frequency ratio of the frequency of the audio master clock to the frequency of the sampling clock, and the SD, and the second communication device includes a restoration unit that receives a packet transmitted from the first communication device and restores, from the packet, the SD, a bit width of the SD, the frequency of the sampling clock, a frequency ratio of a frequency of the audio master clock to the frequency of the sampling clock, a number of predetermined first reference clocks included in one cycle of a frequency-divided signal of the audio master clock, the frequency of the sampling clock, and a frequency division ratio of the frequency divided signal to the audio master clock, an audio master clock regenerator that regenerates the audio master clock on the basis of the number of first reference clocks, a frequency of the first reference clock, and the frequency division ratio, and an SCK regenerator that regenerates a serial clock (SCK) on the basis of bit width information of the SD, the frequency ratio, and the audio master clock.

According to the present disclosure, there is provided a communication system including:

a first communication device; and a second communication device that performs serial communication with the first communication device, in which the first communication device includes a measurement unit that receives a word select (WS) signal conforming to an Inter-IC Sound (I2S) standard, and that measures first timing information indicating a timing of a logical change of the WS signal in a first piece of serial data (SD) among a plurality of pieces of the SD included in one packet transmitted to the second communication device and second timing information indicating a timing of a logical change of the WS signal in a last piece of the SD among the plurality of pieces of the SD, on the basis of a predetermined reference clock used in common with the second communication device, and a packet generator that generates the packet including a bit width of the SD, a frequency of a sampling clock to sample an audio signal, the first timing information, the second timing information, a number of pieces of the SD included in the one packet, and the SD, the second communication device includes a restoration unit that receives packets transmitted from the second communication device and restores, from the packets, serial data (SD) conforming to the I2S standard, bit width information of the SD, frequency information of serial clock (SCK), first timing information indicating a timing when a word select (WS) signal first changes logically from the WS signal included in one of the packets, second timing information indicating a timing when the WS signal last changes logically from the WS signal included in one of the packets, and a number of pieces of the SD included in one of the packets, a clock generator that generates a reference clock used in common with the first communication device, a WS signal regenerator that regenerates the WS signal on the basis of the first timing information, the second timing information, the number of pieces of the SD, and the reference clock, an audio master clock regenerator that multiplies a frequency of the WS signal regenerated by the WS signal regenerator and regenerates an audio master clock, and an SCK regenerator that regenerates the SCK on the basis of the WS signal regenerated by the WS signal regenerator and the bit width information of the SD.

BRIEF DESCRIPTION OF DRAWINGS

FIG. 2A is a diagram describing a frequency division multiplexing system.

FIG. 2B is a diagram describing a time-division multiplexing system.

FIG. 8 is a diagram illustrating transmission parameters used to regenerate the MCK on a reception side.

FIG. 9 is a configuration diagram of an application packet generated in the SerDes.

FIG. 10A is a diagram illustrating a configuration of a header (I2S header) of an application packet for I2S signal transmission.

FIG. 10B is a diagram illustrating a configuration of data and CRC of the application packet for I2S signal transmission.

FIG. 11C is a timing chart of a right justified format.

FIG. 14 is a diagram illustrating values of parameters used when the SerDes according to the second embodiment regenerates an MCK.

FIG. 22A is a diagram illustrating a configuration of a header of an application packet for I2S signal transmission.

FIG. 22B is a diagram illustrating a configuration of data and CRC of the application packet for I2S signal transmission.

FIG. 23 is a diagram illustrating an example in which an I2S signal is included in the application packet for transmitting video data and transmitted.

DESCRIPTION OF EMBODIMENTS

Hereinafter, embodiments of a communication device, a communication system, and a communication method will be described with reference to the drawings. Although main components of the communication device and the communication system will be mainly described below, the communication device and the communication system may have components and functions that are not illustrated or described. The following description does not exclude components and functions that are not illustrated or described.

(Basic Configuration of Communication System)

Figure 1:
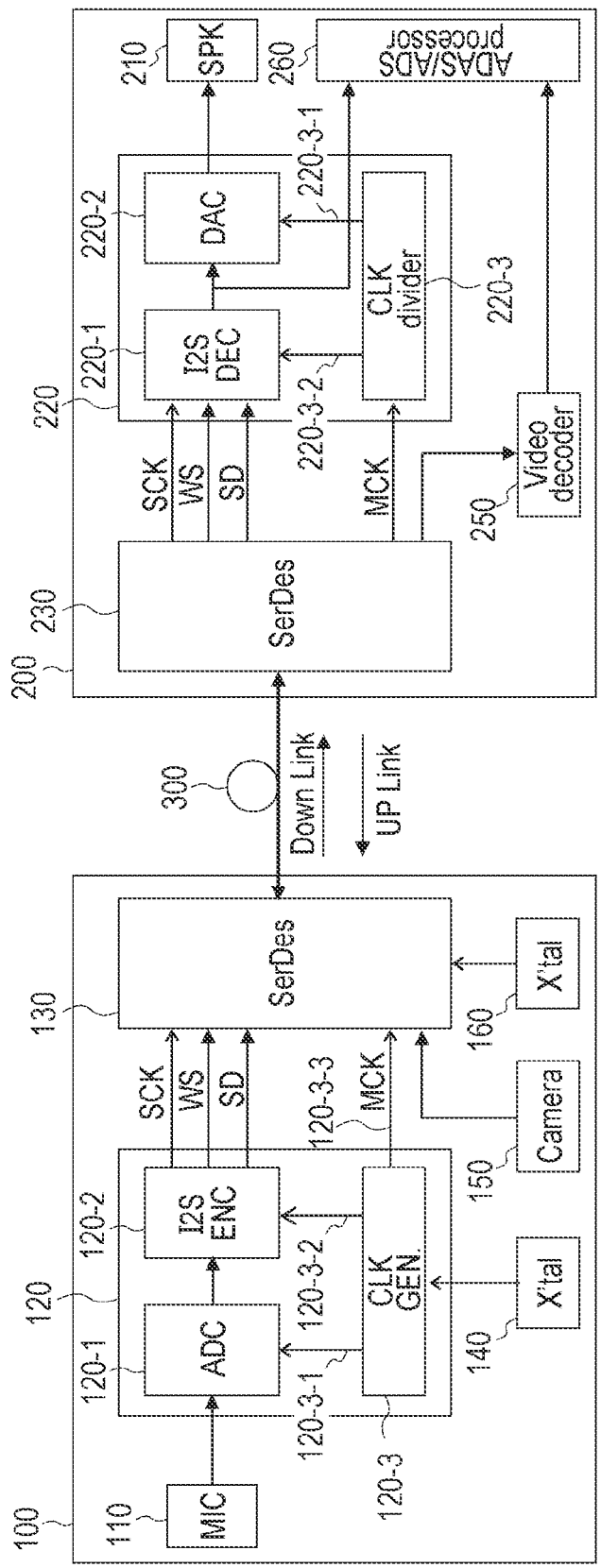
FIG. 1 is a block diagram illustrating a basic configuration of a communication system 1.

FIG. 1 is a block diagram illustrating a basic configuration of a communication system 1 that transmits and receives a signal conforming to the I2S protocol between two SerDes 130 and 230. The communication system 1 in FIG. 1 has a first communication module 100 and a second communication module 200 each having a SerDes for performing high-speed serial communication. The first communication module 100 and the second communication module 200 are connected by a cable 300 of several meters to several tens of meters.

The first communication module 100 and the second communication module 200 can transmit audio signals using I2S, which is an inter-IC audio signal transmission protocol defined in the FPD-LINK standard, which is one of in-vehicle high-speed interface technologies, for example.

Currently, Automotive SerDes Alliance (ASA), which is a high-speed serial interface standard organization for vehicles, is promoting standardization work of high-speed serial interface technology for vehicles. A difference between the FPD-LINK and the ASA is that the ASA uses time division multiplexing TDD (Time Division Duplex) as illustrated in FIG. 2B with respect to the FPD-LINK using a frequency division multiplexing system as illustrated in FIG. 2A as a method for achieving bidirectional communication.

The first communication module 100 illustrated in FIG. 1 has a microphone (hereinafter, a microphone) 110, a first I2S device (I2S audio device) 120, a SerDes (SerDes device) 130, a X'tal 140, a camera 150, and a X'tal 160.

The second communication module 200 has a speaker (SPK) 210, an I2S device (I2S audio device) 220, SerDes (SerDes device) 230, a video decoder 250, and an ADAS/ADS processor 260.

A sound signal (audio signal) collected by the microphone 110 in the first communication module 100 is input to the I2S device 120. The I2S device 120 has an ADC 120-1, an I2S encoder (I2S ENC) 120-2, and a clock generator (CLK GEN) 120-3.

The clock generator 120-3 generates an audio sampling clock, an audio serial clock, and an audio master clock (MCK) in synchronization with a reference clock generated by the X'tal 140.

The ADC 120-1 performs AD conversion on an audio signal from the microphone 110 in synchronization with the audio sampling clock to generate audio data. The I2S encoder 120-2 encodes audio data in synchronization with the audio serial clock, and generates a serial clock (SCK), a word select (WS) signal, and serial data (SD) conforming to the I2S protocol. In the present description, the SCK, WS, and SD may be collectively referred to as an I2S signal.

The SCK, WS signal, SD, and MCK generated by the I2S device 120 are input to the SerDes 130. Furthermore, video data captured by the camera 150 and a reference clock generated by the X'tal 160 are input to the SerDes 130.

The SerDes 130 generates a packet including audio data corresponding to the audio signal collected by the microphone 110, and transmits the packet to the SerDes 230 via the cable 300. The packet is transmitted within a period allocated in TDD. The SerDes 230 receives the packet transmitted from the SerDes 130, restores the original SCK, WS signal, SD, and MCK, and restores the video data captured by the camera 150.

The SCK, WS signal, SD, and MCK restored by the SerDes 230 are input to the I2S device (I2S audio device) 220. The I2S device 220 has an I2S decoder (I2S DEC) 220-1, a DAC 220-2, and a clock divider (CLK divider) 220-3.

The clock divider 220-3 generates an audio sampling clock and an audio serial clock in synchronization with the MCK regenerated by the SerDes 230. The I2S decoder 220-1 restores original audio data in synchronization with the audio serial clock. The restored audio data is supplied to the DAC 220-2 and the ADAS/ADS processor 260. The DAC 220-2 performs DA conversion on the audio data to generate an audio signal, and inputs the audio signal to the speaker 210. Thus, the audio signal collected by the microphone 110 is regenerated from the speaker 210. The ADAS/ADS processor 260 performs analysis of audio data, or the like and uses the audio data for peripheral recognition, for example.

As described above, in the communication system 1 illustrated in FIG. 1, the audio signal collected by the microphone 110 in the first communication module 100 is AD-converted by the I2S device 120 and then converted into the I2S protocol, and then packetized into a transmission format of SerDes in the SerDes 130 and transmitted to the second communication module 200. The SerDes 230 in the second communication module 200 restores the SCK, WS signal, SD, and MCK of the I2S from the received packet. The I2S device 220 performs conversion reverse to that of the I2S device 120 to restore the audio signal, and outputs a sound through the speaker 210. Furthermore, the I2S device 220 also supplies the audio data in an I2S format to the ADAS/ADS processor 260.

(Format of I2S)

Figure 3:
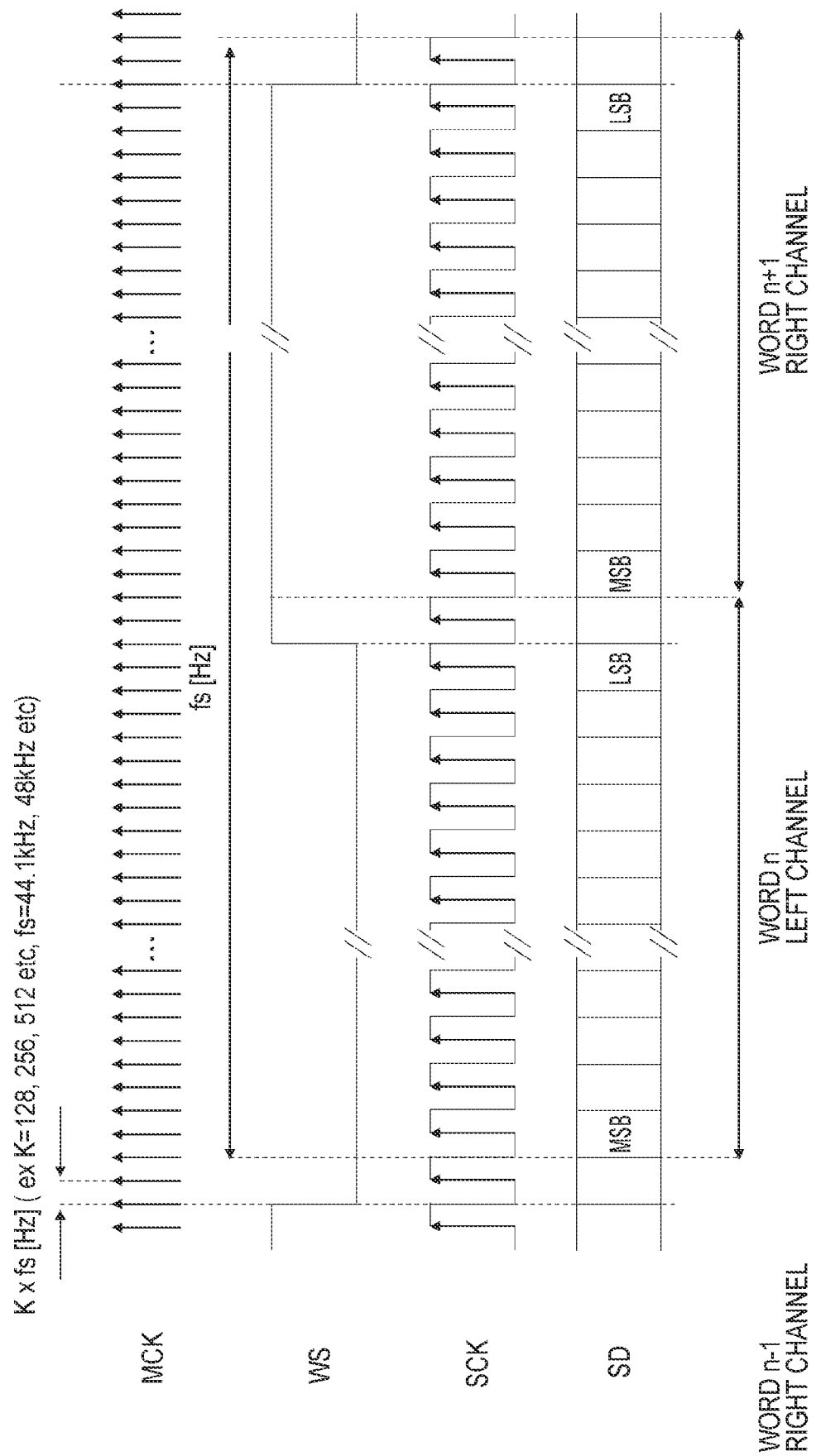
FIG. 3 is a diagram illustrating a format of I2S.

FIG. 3 is a diagram illustrating a format of I2S. FIG. 3 illustrates signal waveforms of the MCK, WS signal, SCK, and SD. The MCK has a frequency of multiplication K of a frequency fs [Hz] of the sampling clock. The multiplication K is, for example, 128, 256, or 512. The WS signal is a signal having the same frequency fs as the sampling clock. One cycle of the WS signal is a bit width of the SD. The bit width of the SD within one cycle of the WS signal is arbitrary. The frequency of the SCK changes according to the bit width of the SD.

The SCK is a clock that defines a timing when each bit in the SD is serially transmitted.

FIG. 3 illustrates an example in which the WS signal transmits left-channel serial data in a low-level period, and the WS signal transmits right-channel serial data in a high-level period. The SD is transmitted bit by bit in order from the MSB side.

In general, an audio master clock MCK obtained by multiplying the sampling frequency fs by K is used for the digital audio processing. Therefore, as illustrated in FIG. 3, in addition to the WS signal, SCK, and SD, the MCK may also be transmitted. The I2S device 120 in FIG. 1 generates the WS signal, SCK, and SD in synchronization with the MCK. This, when the audio signal is transmitted, what is important is that the MCK on a transmission side is accurately regenerated on a reception side, and particularly, it may be required to have a small jitter. This is because when a digital signal is converted into an audio signal by the DAC 220-2 on the reception side, if the sampling clock including the jitter is used, modulation distortion in the time direction occurs, and as a result, audio quality (S/N) is deteriorated.

In recent years, high quality audio devices have become widespread and a high dynamic range signal is transmitted at a frequency of a high sampling clock, and thus a demand for clock jitter on a regeneration side has become severe. In order to transmit the audio signal with high quality using the high-speed serial interface technology, it may be necessary to accurately transmit the frequency fs of the sampling clock or the MCK of an integer multiple thereof. However, the frequency used in the high-speed serial interface technology such as the SerDes 130 and 230 is a frequency independent of the frequency (44.1 kHz, 48 kHz, 96 kHz, 192 kHz, or the like) of the sampling clock or the MCK (22.5792 MHz, 24.576 MHz, or the like) used in general audio signal processing. Even if the frequency of the sampling clock used in the audio signal processing and the frequency used in the high-speed serial interface are asynchronous with each other, it may be necessary to enable correct regeneration of the audio signal transmitted via the high-speed serial interface at the transmission destination. However, in existing high-speed serial transmission protocols such as the FPD-LINK described above, a specific procedure for serially transmitting an asynchronous audio signal has not been clarified.

A communication device and a communication system 1 according to the present disclosure described below are characterized in that audio signals conforming to the I2S standard can be transmitted and correctly regenerated in a high-speed serial interface technology, for example, the ASA standard.

First Embodiment

Figure 4:
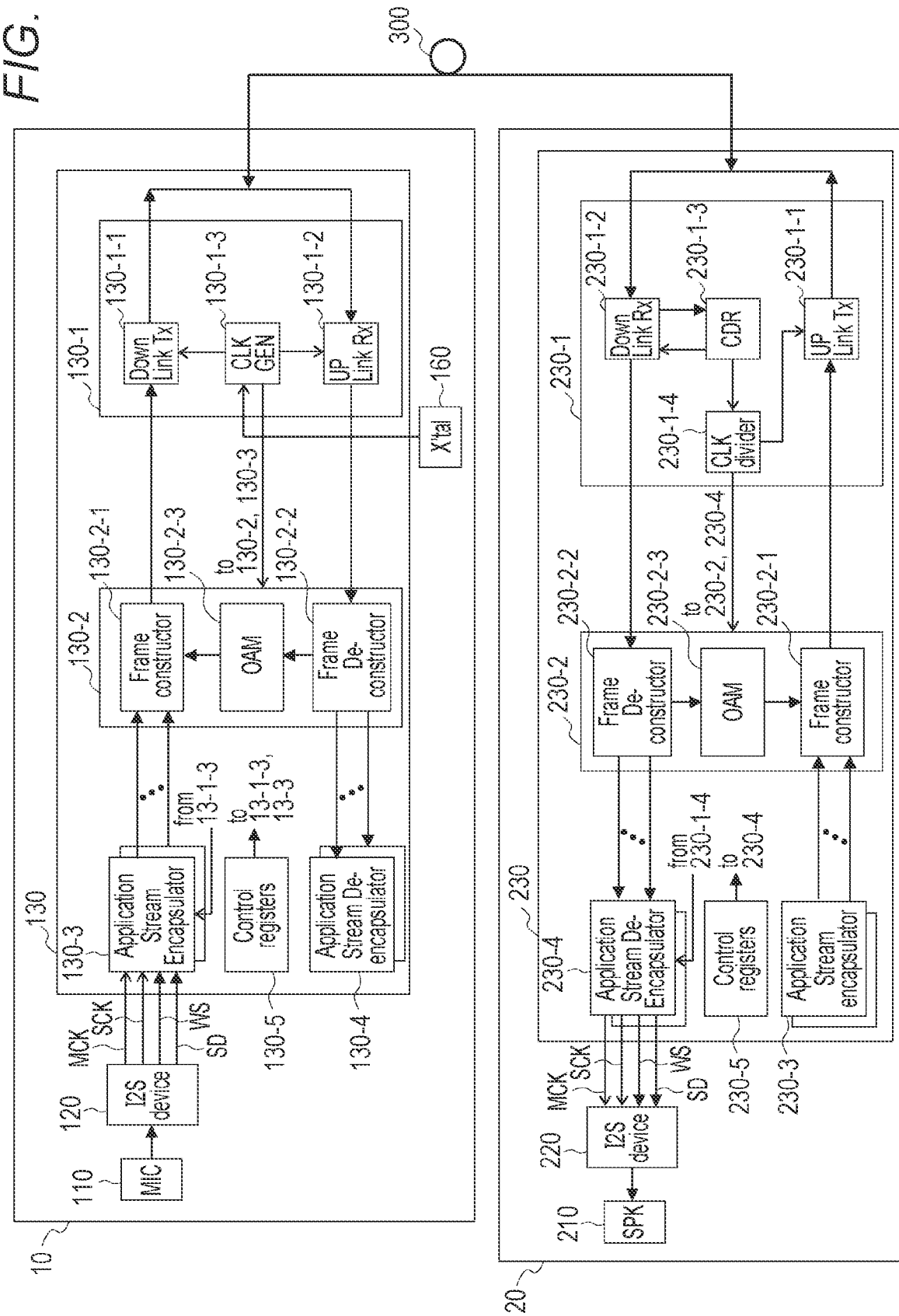
FIG. 4 is a block diagram illustrating a schematic configuration of a communication system including a communication device according to a first embodiment.

FIG. 4 is a block diagram illustrating a schematic configuration of a communication system 1 including a communication device according to a first embodiment. In FIG. 4, components common to those in FIG. 1 are denoted by the same reference numerals, and differences will be mainly described below. Furthermore, in FIG. 4, a flow of signal processing of the I2S signal is indicated by an arrow line.

The communication system 1 in FIG. 4 includes a first communication module (first communication device) 10 and a second communication module (second communication device) 20.

The first communication module 10 has the microphone 110, the I2S device 120, the SerDes 130, and the X'tal 160.

The second communication module 20 includes the speaker 210, the I2S device 220, and the SerDes 230.

The SerDes 130 is a PHY clock master. That is, the SerDes 130 generates a PHY clock used in the physical layer of the SerDes 130 on the basis of the X'tal 160.

On the other hand, the SerDes 230 is a PHY clock follower that operates in synchronization with the PHY clock generated by the SerDes 130. More specifically, the SerDes 130 generates a transmission symbol of Down Link by using the PHY clock as a symbol clock, and transmits the transmission symbol to the SerDes 230 via the cable 300. The SerDes 230 regenerates the PHY clock from the received transmission symbol, and decodes the received transmission symbol by the regenerated PHY clock. Here, the transmission symbol is a minimum unit of a transmission signal change section. In a case of pulse amplitude modulation (PAM) 2, it is a section in which one bit is transmitted per transmission symbol. In a case of PAM 4, it is a section in which two bits are transmitted.

As illustrated in FIG. 4, the SerDes 130 has a PHY unit (PHY block) 130-1, a link unit (LINK block) 130-2, an encapsulator (Application System Encapsulator) 130-3, a deencapsulator (Application System Deencapsulator) 130-4, and control registers 130-5. The encapsulator 130-3 and the deencapsulator 130-4 are provided for each application such as I2S signal transmission. In the present description and the drawings, the encapsulator 130-3 and the deencapsulator 130-4 for I2S signal transmission will be mainly described.

The PHY unit 130-1 has a Down Link transmitter (Down Link Tx) 130-1-1, a PHY clock generator (CLK GEN) 130-1-3, and an UP Link receiver (UP Link Rx) 130-1-2. The LINK unit 130-2 has a frame constructor 130-2-1, an operation application maintenance (OAM) unit 130-2-3, and a frame deconstructor 130-2-2.

(Configurations of Packet and Frame)

Figure 5:
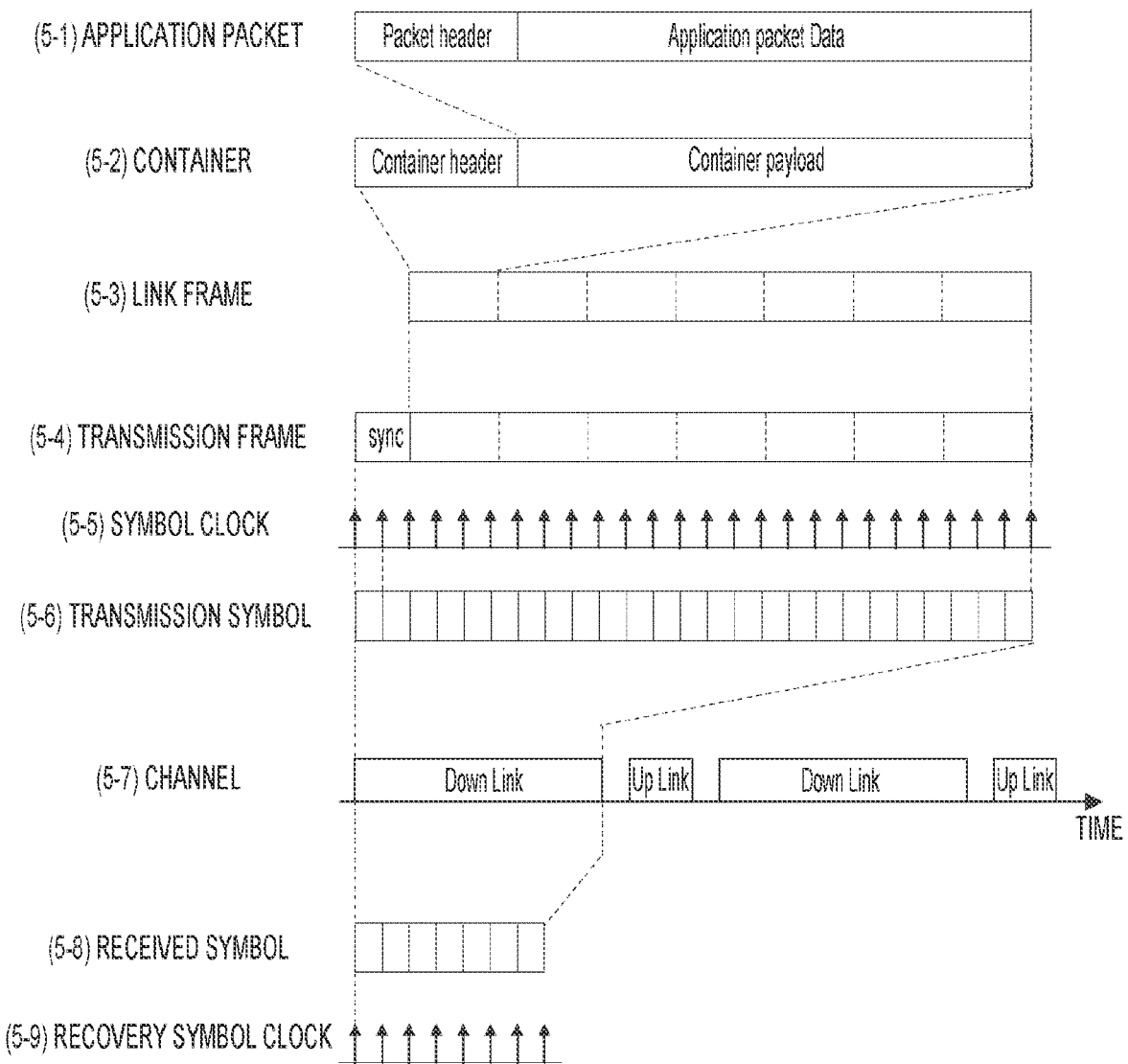
FIG. 5 is a diagram illustrating a configuration of a packet and frames generated in a SerDes in FIG. 4.

FIG. 5 is a diagram illustrating configurations of a packet and frames generated in the SerDes 130 in FIG. 4.

In order to transmit the audio signal from the microphone 110, a video signal from the camera 150, or the like, the encapsulator 130-3 in FIG. 4 packetizes a signal from an application of the microphone 110, the camera 150, or the like and adds a header to the packet to generate an application packet ((5-1) in FIG. 5). The application packet generated by the encapsulator 130-3 is transmitted to the frame constructor 130-2-1 in the LINK unit 130-2.

The OAM unit 130-2-3 in the link unit 130-2 generates information for monitoring a control or transmission state of the SerDes 130 and includes the information in the application packet. The frame constructor 130-2-1 generates a container including a container header ((5-2) in FIG. 5), and further generates a Link frame in which a plurality of containers is put together ((5-3) in FIG. 5). The container includes a plurality of application packets. The container header includes, in each of a plurality of application packets, an address of the SerDes 130 itself, an address of the SerDes 230 that is a connection destination, a destination of the application packet, content information of the application packet, and the like.

The Link frame generated by the frame constructor 130-2-1 is sent to the Down Link transmitter 130-1-1 in the PHY unit 130-1. In processing of the LINK unit 130-2, a clock of a predetermined frequency synchronized with the symbol clock generated by the PHY clock generator 130-1-3 in the PHY unit 130-1 is used.

The Down Link transmitter 130-1-1 in the PHY unit 130-1 adds a synchronization signal having a special pattern to the Link frame to generate a transmission frame ((5-4) in FIG. 5).

On the other hand, the PHY clock generator 130-1-3 in the PHY unit 130-1 generates a symbol clock ((5-5) in FIG. 5) of a transmission symbol rate (for example, 2 GHz, 4 GHz, 8 GHz, or the like) of the transmission signal generated in synchronization with the reference clock generated by the X'tal 160, and supplies the symbol clock to the Down Link transmitter 130-1-1.

The Down Link transmitter 130-1-1 converts the transmission frame into a transmission symbol ((5-6) in FIG. 5) in synchronization with the symbol clock and transmits the transmission symbol to the transmission cable 300 ((5-7) in FIG. 5).

Next, reception processing of the SerDes 230 on the reception side will be described. The SerDes 230 in FIG. 4 has a PHY unit 230-1, a LINK unit 230-2, an encapsulator (Application Stream Encapsulator) 230-3, a deencapsulator (Application Stream Deencapsulator) 230-4, and control registers 230-5.

The PHY unit 230-1 has an UP Link transmitter (UP Link Tx) 230-1-1, a Down Link receiver (Down Link Rx) 230-1-2, a clock data recovery (CDR) 230-1-3, and a clock divider 230-1-4.

Upon receiving the transmission symbol, the Down Link receiver 230-1-2 sends the received transmission symbol to the CDR 230-1-3. The CDR 230-1-3 extracts a change point in the signal level of the received transmission symbol and regenerates a symbol clock synchronized with the transmission symbol rate ((5-9) in FIG. 5). The CDR 230-1-3 sends the restored symbol clock to the Down Link receiver 230-1-2 and the clock divider 230-1-4.

The Down Link receiver 230-1-2 determines the reception level of the transmission symbol received at an appropriate timing in synchronization with the symbol clock regenerated in the CDR 230-1-3. Thus, the Down Link receiver 230-1-2 can correctly receive the transmission symbol. The Down Link receiver 230-1-2 restores the transmission frame from the transmission symbol. Furthermore, the Down Link receiver 230-1-2 determines the position of a subsequent Link frame using the synchronization signal (sync) added to the transmission frame as a clue.

The clock divider 230-1-4 generates an appropriate symbol clock for UP Link transmission processing of the SerDes 230. The frequency of the symbol clock generated by the clock divider 230-1-4 is, for example, 2 GHz or 4 GHz.

The clock divider 230-1-4 generates a symbol clock for the UP Link in synchronization with the symbol clock of the Down Link regenerated by the CDR 230-1-3, and supplies the generated symbol clock to the UP Link transmitter. Furthermore, in addition, the clock divider 230-1-4 supplies a clock of an appropriate frequency used for Link frame processing in the LINK unit 230-2 to the LINK unit 230-2.

The LINK unit 230-2 has a frame deconstructor 230-2-2, an OAM unit (OAM) 230-2-3, and a frame constructor 230-2-1.

The frame deconstructor 230-2-2 decodes the container header of each container ((5-2) in FIG. 5) included in the Link frame ((5-3) in FIG. 5) input from the Down Link receiver 230-1-2, sends a container payload to the OAM unit 230-2-3 in a case of a container of the OAM unit 230-2-3, and sends a container payload to the deencapsulator 230-4 corresponding to each application in a case of a container of the application.

The deencapsulator 230-4 decodes a packet header of the application packet ((5-1) in FIG. 5) corresponding to the container payload transmitted from the frame deconstructor 230-2-2, determines content of the subsequent application packet and performs appropriate processing, and restores an application signal before transmission (the I2S signal in a case of FIG. 4). The restored application signal is sent to a corresponding application. In the case of FIG. 4, the restored I2S signal is sent to the I2S device 220. The I2S device 220 restores the I2S signal to an audio signal and regenerates a sound from the speaker 210.

The above is signal processing when the audio signal collected by the microphone 110 is converted into the I2S protocol by the I2S device 120 to generate an application packet, the generated application packet is transmitted from the SerDes 130 to the SerDes 230 and restored to the I2S signal in the SerDes 230, the I2S signal is restored to the audio signal by the I2S device 220, and an audio is output from the speaker 210.

Conversely, it is also possible to generate an application packet in the SerDes 230 on the basis of a signal from an application connected to the SerDes 230, transmit the application packet to the SerDes 130 via the UP Link in a procedure reverse to the above, and regenerate the signal in the application connected to the SerDes 130.

At this time, the symbol clock used for processing of the UP Link transmitter 230-1-1 in the SerDes 230 is synchronized with the symbol clock ((5-9) in FIG. 5) regenerated by the Down Link receiver 230-1-2 and the CDR 230-1-3. In this manner, the respective symbol clocks of the Down Link and the UP Link between the SerDes 130 and the SerDes 230 are in a synchronization relationship with reference to the PHY clock generator 130-1-3 in the SerDes 130, and the UP Link receiver 130-1-2 in the SerDes 130 on the reception side of the UP Link can easily receive the UP Link signal from the SerDes 230 by the UP Link symbol clock generated by the PHY clock generator 130-1-3.

(Details of Transmission Side)

Figure 6:
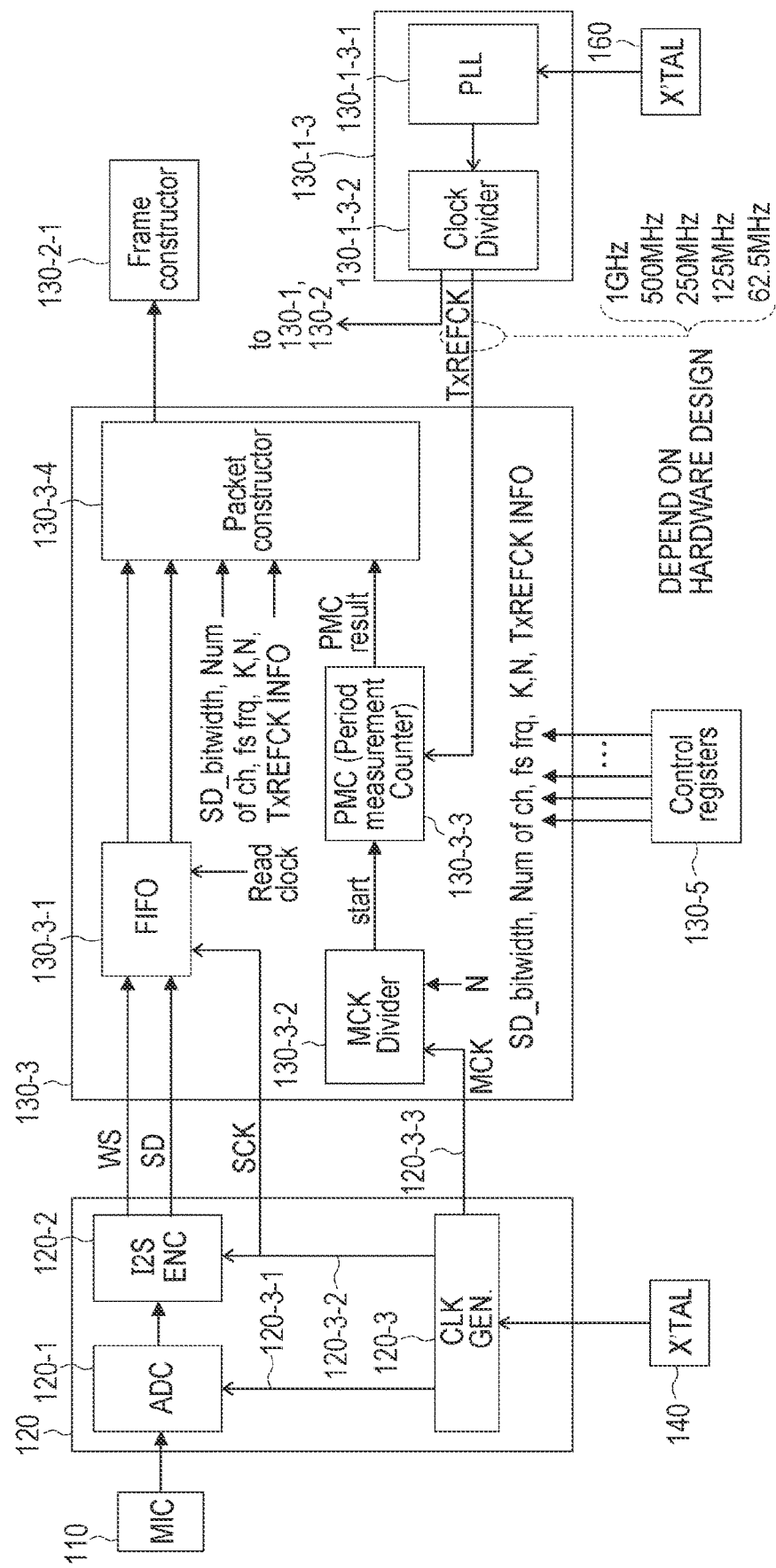
FIG. 6 is a block diagram illustrating internal configurations of an I2S device, and an encapsulator and a PHY clock generator in the SerDes on a transmission side.

FIG. 6 is a block diagram illustrating internal configurations of the I2S device 120, and the encapsulator 130-3 and the PHY clock generator 130-1-3 in the SerDes 130 on the transmission side.

The I2S device 120 illustrated in FIG. 6 has the ADC 120-1, the I2S encoder 120-2, and the clock generator 120-3, similarly to the I2S device 120 in FIG. 1. The clock generator 120-3 generates the audio sampling clock, the audio serial clock, and the audio master clock MCK in synchronization with the reference clock generated by the X'tal 140.

The encapsulator 130-3 in FIG. 6 corresponds to the I2S device 120, and has a FIFO 130-3-1, an MCK divider 130-3-2, a period measurement counter (PMC) 130-3-3, and a packet constructor 130-3-4.

The PHY clock generator 130-1-3 has a PLL circuit 130-1-3-1 and a clock divider 130-1-3-2. The reference clock generated by the X'tal 160 is input to the PHY clock generator 130-1-3. The PLL circuit 130-1-3-1 generates a clock synchronized with the reference clock generated by the X'tal 160. The clock divider 130-1-3-2 divides the clock generated by the PLL circuit 130-1-3-1 to generate a PHY clock. The PHY clock is used not only in internal processing of the Down Link transmitter 130-1-1, the UP Link receiver 130-1-2, and the LINK unit 130-2, but also as a reference clock for transmitting the MCK. In FIG. 6, the PHY clock generated by the PHY clock generator 130-1-3 is referred to as a reference clock TxREFCK.

In general, although depending on individual implementation, symbol rates of signals transmitted on the Down Link and the UP Link are standardized, and for example, 2 GHz, 4 GHz, 6 GHz, and 8 GHz are standardized according to transmission speeds. One GHz, 500 MHz, 250 MHz, 125 MHz, 62.5 MHz, and the like having a frequency division relationship of these symbol rates can be easily generated. Therefore, in the present embodiment, an example in which any one of 1 GHz, 500 MHz, 250 MHz, 125 MHz, and 62.5 MHz is used as the reference clock TxREFCK will be described.

Figure 7:
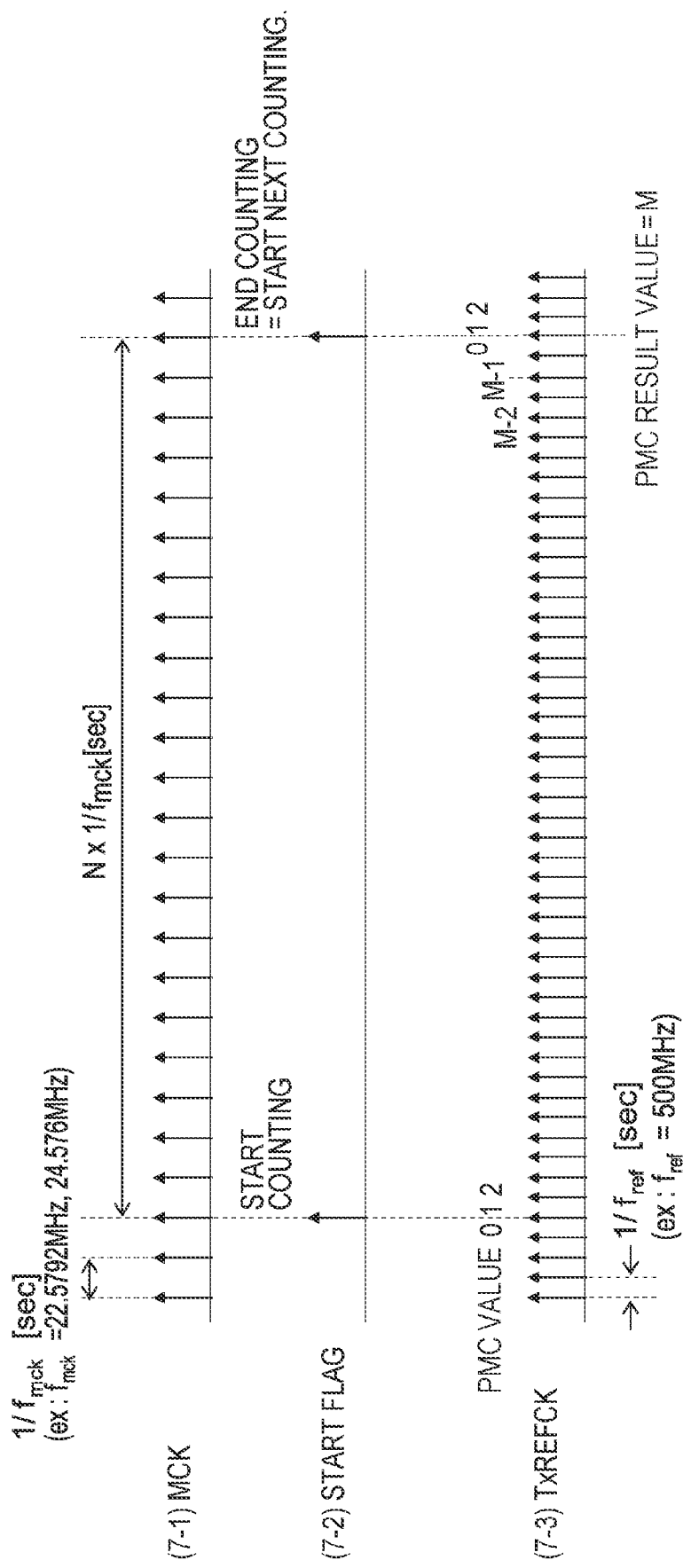
FIG. 7 is a timing chart of a TxREFCK and an MCK generated on the basis of a symbol clock of a PHY clock generator.

FIG. 7 is a timing chart of the TxREFCK and MCK generated on the basis of the symbol clock of the PHY clock generator 130-1-3. FIG. 8 is a diagram illustrating an example of transmission parameters used to regenerate the MCK on the reception side. FIG. 9 is a configuration diagram of an application packet generated in the SerDes 130.

The X'tal 140 is connected to the first I2S device 120. The clock generator 120-3 generates a sampling clock 120-3-1, an MCK 120-3-3, and an SCK 120-3-2 in synchronization with the clock generated by the X'tal 140.

The ADC 120-1 converts the sound signal (audio signal) collected by the microphone 110 into a digital signal by the sampling clock 120-3-1. The I2S encoder 120-2 converts the digital signal into the I2S format illustrated in FIG. 3 and inputs the converted signal to the connected encapsulator 130-3 for I2S transmission.

The encapsulator 130-3 stores the WS signal and the SD from the I2S encoder 120-2 in the FIFO 130-3-1 in synchronization with the SCK. The I2S signal in the FIFO 130-3-1 is read by a read clock at an appropriate speed, and an application packet is generated in the packet constructor 130-3-4 ((9-3) in FIG. 9).

As illustrated in FIG. 7, the MCK divider 130-3-2 counts an integer value N set in the control registers 130-5 with the MCK input from the I2S device 120, generates a start flag for each N, and outputs the start flag to the PMC 130-3-3. ((9-1) and (9-2) in FIG. 9).

The PMC 130-3-3 counts the TxREFCK as the length of a start flag section output from the MCK divider 130-3-2, and outputs a count value (PMC result value=M) to the packet constructor 130-3-4. (7-3 in FIG. 7). The MCK divider 130-3-2 and the PMC 130-3-3 are measurement units that measure the number of reference signals TxREFCK included in one cycle of the MCK frequency divided signal.

The control registers 130-5 output a bit length (bit width of SD) of the SD (I2S audio data) to be transmitted, the number of audio channels to be transmitted, the frequency (fs frq) of the sampling clock, the multiplication number K of the sampling clock (frequency fmck=K×fs frq of the audio master clock MCK), an MCK frequency division number N, and frequency information (TxREFCK INFO) of TxREFCK to the packet constructor 130-3-4.

The packet constructor 130-3-4 stores both these pieces of information and the PMC result value M together in the packet header ((9-2) in FIG. 9). As described above, the packet constructor 130-3-4 generates an application packet ((9-1) in FIG. 9) on the basis of the information from the control registers 130-5, the PMC result value, and the I2S signal (SD), and outputs the application packet to the frame constructor 130-2-1.

FIG. 8 illustrates values of the frequency division number N of the audio master clock MCK and a count value (PMC result value M) of the predicted TxREFCK at that time in a case where the TxREFCK frequency is 250 MHz, the frequency fs of the sampling clock is 44.1 kHz, and with the audio master clock MCK of 512 times 48 kHz (K=512).

(Configuration of Application Packet for I2S Transmission)

FIGS. 10A and 10B are diagrams illustrating a configuration of an application packet for I2S signal transmission. FIG. 10A illustrates a configuration of a header (I2S header) of an application packet for I2S signal transmission, and FIG. 10B illustrates a configuration of data (I2S data) and CRC of the application packet for I2S signal transmission.

Bits [7:5] of a first byte of the I2S header illustrated in FIG. 10A are an I2S frame format. It is I2S format if the bits [7:5] are 000, left justified if the bits [7:5] are 001, and right justified if the bits [7:5] are 010, and 011 to 111 are reserved.

Figure 11A:
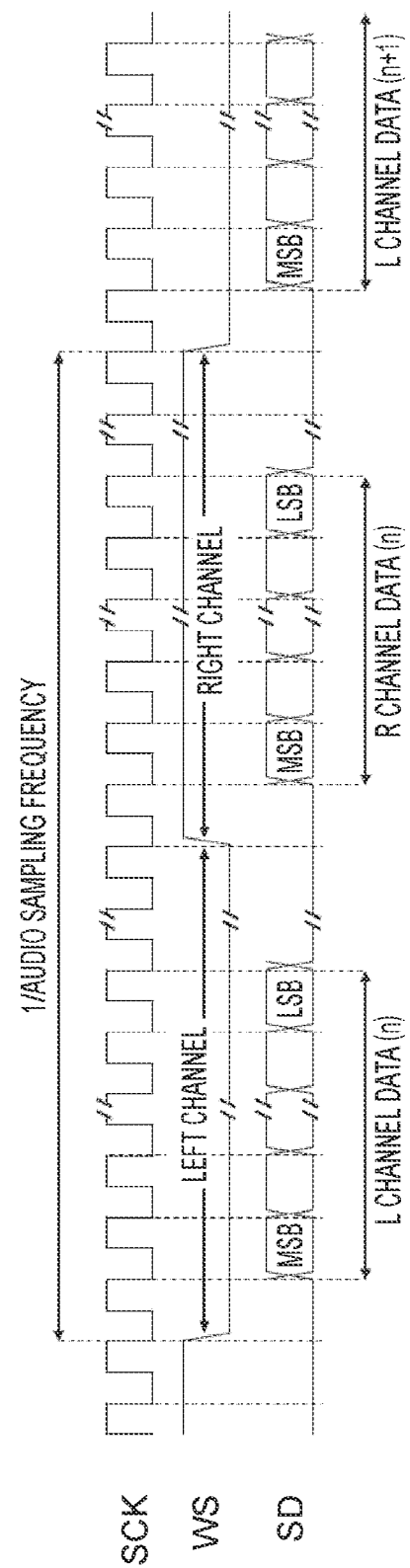
FIG. 11A is a timing chart of an original format of the I2S.
Figure 11B:
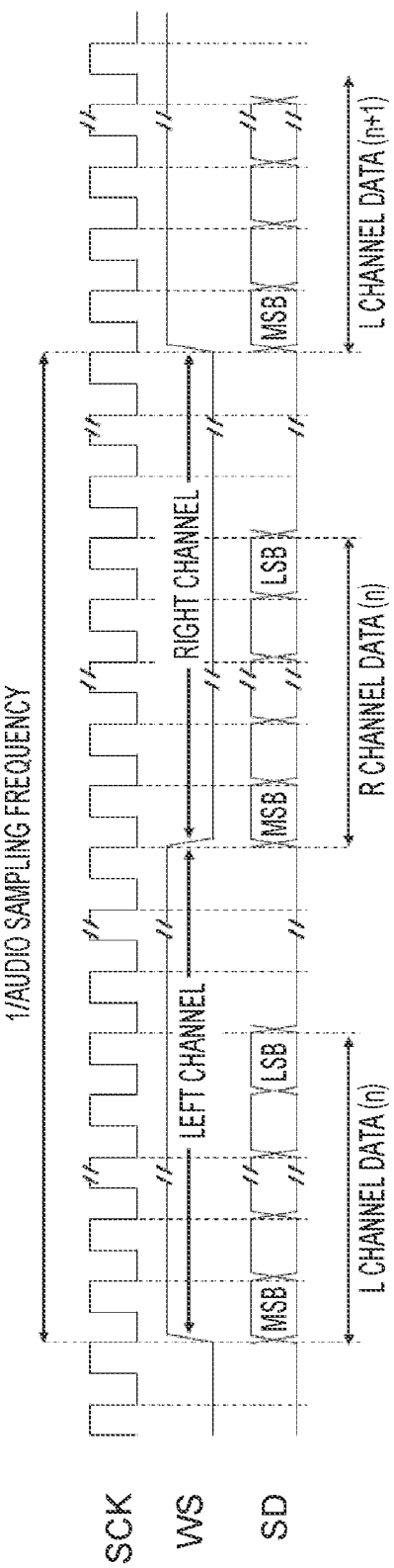
FIG. 11B is a timing chart of a left justified format.

FIG. 11A is a timing chart of an original format of the I2S, FIG. 11B is a timing chart of a left justified format, and FIG. 11C is a timing chart of a right justified format.

As illustrated in FIG. 11A, in the original format of I2S, the SD is transmitted bit by bit in order from the MSB within the period in which the WS signal is at the low level. As illustrated in FIG. 11B, in the left justified format, the SD signal is transmitted bit by bit in order from the MSB in synchronization with the timing when the WS signal shifts from the low level to the high level. That is, the SD signal is transmitted in a left justified manner in accordance with the timing when the WS signal rises. On the other hand, in the right justified format, as illustrated in FIG. 11C, the LSB of the SD signal is transmitted in a right justified manner at the timing when the WS signal shifts from the high level to the low level. The bits [7:5] of the first byte in FIG. 10A specify whether the SD signal is left justified or right justified.

Bits [4:3] of the first byte of the I2S header illustrated in FIG. 10A are an I2S data bit width. If the bits [4:3] are 00, it is 16 bits, if the bits are 01, it is 18 bits, if the bits are 10, it is 20 bits, and if the bits are 11, it is 24 bits.

Bits [2:0] of the first byte of the I2S header illustrated in FIG. 10A are a 3-bit integer representing the number of stereos. If the bits [2:0] are 1, it means that one stereo (L×R) is transmitted, and if the bits [2:0] are 4, it means that four stereos are transmitted. Bits [7:5] of a second byte of the I2S header illustrated in FIG. 10A are the frequency Fs of the sampling clock.

If the bits [7:5] are 000, it is 44.1 kHz, if the bits are 001, it is 48 kHz, if the bits are 010, it is 96 kHz, if the bits are 011, it is 192 kHz, and 100 to 111 are reserved.

Bits [4:0] of the second byte of the I2S header illustrated in FIG. 10A are a multiplication value K for generating the audio master clock MCK. If the bits [4:0] are 0x00, it is 32, if the bits are 0x01, it is 64, if the bits are 0x02, it is 128, if the bits are 0x03, it is 256, if the bits are 0x04, it is 512, if the bits are 0x05, it is 1024, and 0x06 to 0x1F are reserved.

Bits [7:5] of a third byte of the I2S header illustrated in FIG. 10A are reserved.

Bits [4:0] of the third byte of the I2S header illustrated in FIG. 10A are upper five bits N [12:8] of the frequency division ratio N of the audio master clock MCK. The frequency division ratio N is a 13-bit integer. Bits [7:0] of a fourth byte of the I2S header illustrated in FIG. 10A are N [7:0], which are lower eight bits of the audio master clock MCK.

The frequency division ratio N of the audio master clock MCK depends on the frequency Fm (=24.576 MHz, 22.5792 MHz, or the like) of the audio master clock MCK. N=1536 if Fm=24.576 MHz, and N=7056 if Fm=22.5792 MHz.

A bit 7 of a fifth byte of the I2S header illustrated in FIG. 10A is reserved. Bits [6:4] of the fifth byte of the I2S header illustrated in FIG. 10A are TxREFCK information. If the bits [6:4] are 000, it is 1 GHz, if the bits are 001, it is 500 MHz, if the bits are 010, it is 250 MHz, if the bits are 100, it is 125 MHz, if the bits are 101, it is 62.5 MHz, if the bits are 110, it is 31.25 MHz, and if the bits are 111, it is another frequency.

Bits [3:2] of the fifth byte of the I2S header illustrated in FIG. 10A are reserved. [1:0] of the fifth byte of the I2S header illustrated in FIG. 10A is the PMC result value [17:16]. The PMC result value is 18-bit integer data. Bits [7:0] of a sixth byte of the I2S header illustrated in FIG. 10A are the PMC result value [15:8], and bits [7:0] of a seventh byte are the PMC result value [7:0]. The PMC result value is a value obtained by counting Fm/N (seconds) by the reference clock TxREFCK of 250 MHz. Ideally, when Fm=24.576 MHz and N=1536, the PMC result value=15625. When Fm=22.5792 MHz and N=7056, the PMC result value=78125.

A reception device can use the PMC result value and N to regenerate the Fm.

I2S data illustrated in FIG. 10B starts from the mth byte. Bits [7:0] of each byte are an I2S data field. More specifically, bits [7:0] of a (m+n−1+p)th byte in the I2S data are an nth piece of stereo data and are I2S data [15:8] of an L-channel of a sample p, and bits [7:0] of a (m+1+n−1+p)th byte are the nth piece of stereo data and are I2S data [7:0] of the L-channel of the sample p.

These two bytes are nth piece of stereo data and are a data format having a data width of 16 bits of L channel. Bits [7:0] of a (m+2+n−1+p)th byte of the I2S data illustrated in FIG. 10B are the nth piece of stereo data and are I2S data [15:8] of an R channel of the sample p, and bits [7:0] of a (m+3+n−1+p)th byte are the nth piece of stereo data and are I2S data [7:0] of the R channel of the sample p. These two bytes are the nth piece of stereo data and are a data format having a data width of 16 bits of the R channel.

The bits [7:0] of the (m+n−1+p)th byte of the I2S data illustrated in FIG. 10B are the nth piece of stereo data and are I2S data [23:16] of the L channel of the sample p, the bits [7:0] of the (m+1+n−1+p)th byte are the nth piece of stereo data and are the I2S data [15:8] of the L channel of the sample p, and the bits [7:0] of the (m+2+n−1+p)th byte are the nth piece of stereo data and are the I2S data [7:0] of the L channel of the sample p.

These three bytes are data formats having data widths of 18, 20, and 24 bits of the L channel in the nth piece of stereo data, and if the data width is 18 bits or 20 bits, a bit field larger than the data width is filled with 0. The bits [7:0] of the (m+3+n−1+p)th byte of the I2S data illustrated in FIG. 10B are the nth piece of stereo data and are the I2S data [23:16] of the R channel of the sample p, bits [7:0] of a (m+4+n−1+p)th byte are the nth piece of stereo data and are the I2S data [15:8] of the R channel of the sample p, and bits [7:0] of a (m+5+n−1+p)th byte are the nth piece of stereo data and are the I2S data [7:0] of the R channel of the sample p. These three bytes are data formats having data widths of 18, 20, and 24 bits of the R channel in the nth piece of stereo data, and if the data width is 18 bits or 20 bits, a bit field larger than the data width is filled with 0. Bits [7:0] of a kth byte of the CRC illustrated in FIG. 10B are CRC 32 [31:24], bits [7:0] of a (k+1)th byte are CRC 32 [23:16], bits [7:0] of a (k+2)th byte are CRC 32 [15:8], and bits [7:0] of a (k+3)th byte are CRC 32 [7:0]. The CRC 32 checks a GPIO header of each GPIO payload to the end of GPIO data. The cyclic redundancy check (CRC) uses a polynomial ring 0xF4ACFB13.

(Details of Reception Side)

Figure 12:
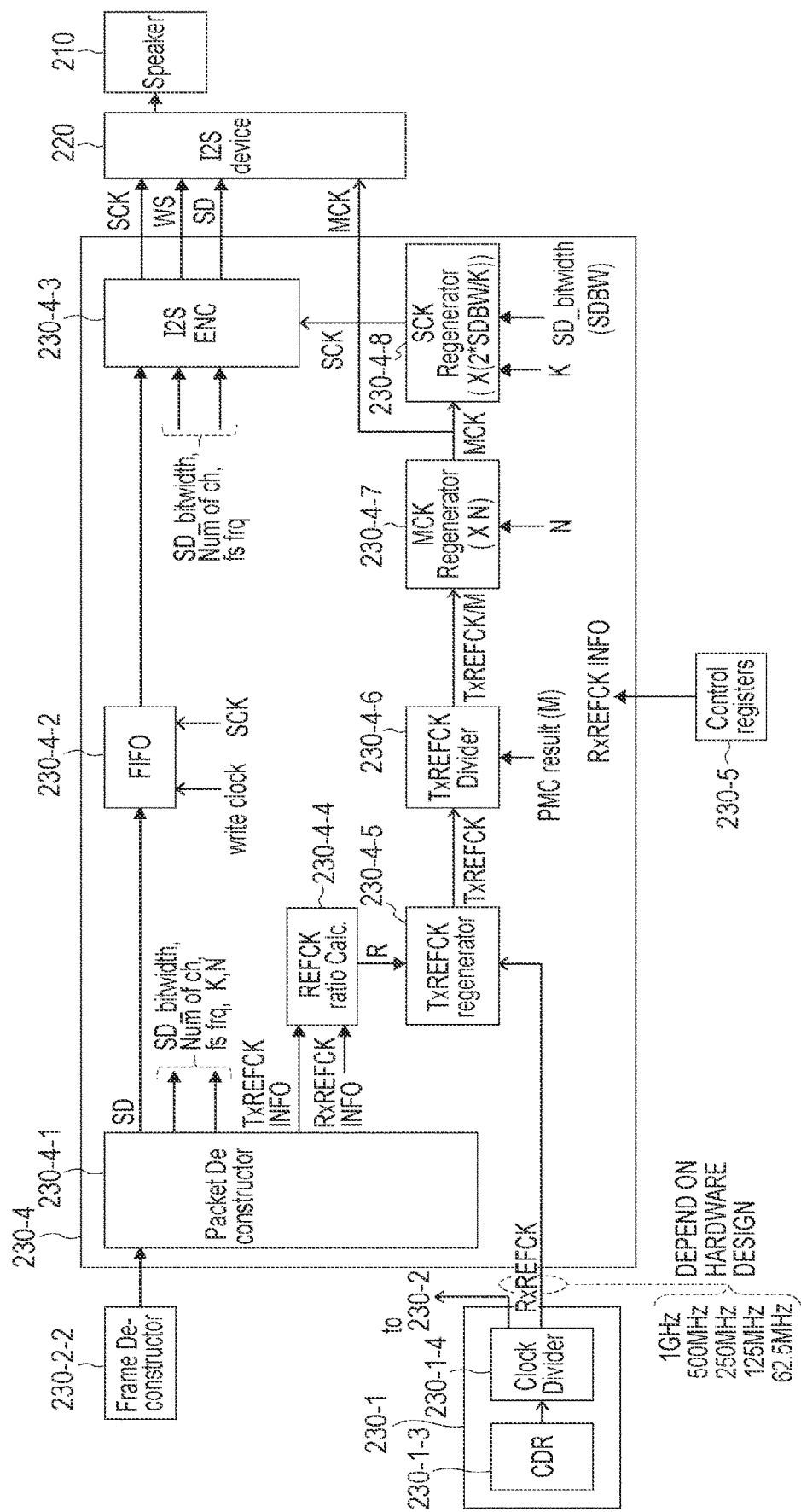
FIG. 12 is a block diagram illustrating an internal configuration of a deencapsulator in the SerDes.

Next, an internal configuration and operation of the SerDes 230 will be described. FIG. 12 is a block diagram illustrating an internal configuration of the deencapsulator 230-4 in the SerDes 230. The deencapsulator 230-4 has a packet deconstructor 230-4-1, a FIFO 230-4-2, an I2S encoder (I2S ENC) 230-4-3, a REFCK ratio calculator 230-4-4, a TxREFCK regenerator 230-4-5, a TxREFCK divider 230-4-6, an MCK regenerator 230-4-7, and an SCK regenerator 230-4-8.

The SerDes 230 regenerates a frequency fmck of the MCK generated by the I2S device 120 on the transmission side, and transmits the frequency fmck to the I2S device 220 together with a regenerated I2S signal (SCK, WS signal, and SD).

As described above, the CDR 230-1-3 in the PHY unit 230-1 in the SerDes 230 on the reception side extracts a change point of the signal level from the received transmission symbol, and regenerates the symbol clock ((5-9) in FIG. 5) synchronized with the transmission symbol rate transmitted from the SerDes 130. The clock divider (230-1-4) divides the symbol clock ((5-9) in FIG. 5) supplied from the CDR 230-1-3, and generates a clock that may be necessary for processing of each unit. As in the SerDes 130 on the transmission side, these clock frequencies depend on individual implementation, but 1 GHz, 500 MHz, 250 MHz, 125 MHz, 62.5 MHz, and the like that are in a frequency division relationship with the symbol rate can be easily generated while maintaining a synchronization relationship with the symbol clock on the transmission side.

Any of 1 GHz, 500 MHz, 250 MHz, 125 MHz, 62.5 MHz, and the like described above is used as the reference clock (RxREFCK) for regenerating the I2S audio master clock MCK on the regeneration side. Since which frequency to use depends on the implementation, the control registers 230-5 supply information (RxREFCK_INFO) thereof to the deencapsulator 230-4 for I2S signal transmission. At the same time, the clock divider 230-1-4 supplies the reference clock (RxREFCK) having a frequency specified by the control registers 230-5 to the deencapsulator 230-4.

Next, an operation of the deencapsulator 230-4 will be described. The frame deconstructor 230-2-2 extracts an application packet ((9-1) in FIG. 9) for transmitting the I2S signal, and supplies the application packet to the packet deconstructor 230-4-1.

The packet deconstructor 230-4-1 analyzes the packet header ((9-2) in FIG. 9) of the application packet ((9-1) in FIG. 9), and acquires information for regenerating the I2S protocol, the bit width of the SD (I2S audio data) to be transmitted, the number of audio channels to be transmitted, the frequency (fs frq) of the sampling clock, the multiplication number K of the sampling clock (the frequency fmck of the audio master clock MCK=K×fs frq), the MCK frequency division number N, the reference clock frequency information (TxREFCK INFO), and the TxREFCK count value (PMC result value).

The RFECK ratio calculator 230-4-4 calculates a frequency ratio R (=TxREFCK frequency/RxREFCK frequency) by the frequency information (TxREFCK INFO) of the transmission side REFCK and the frequency information (RxREFCK INFO) of the reception side REFCK obtained from the control registers 230-5.

Using the obtained frequency ratio R, the TxREFCK regenerator 230-4-5 multiplies the frequency of RxREFCK by R if R≥1, and divides the RxREFCK by R if R<1, thereby regenerating the TxREFCK synchronized with the RxREFCK. The regenerated TxREFCK has the same frequency as the TxREFCK on the transmission side.

The TxREFCK divider 230-4-6 divides the TxREFCK supplied from the TxREFCK regenerator 230-4-5 by the PMC result value M acquired by the packet deconstructor 230-4-1, and outputs the divided TxREFCK/M to the MCK regenerator 230-4-7.

The MCK regenerator 230-4-7 multiplies the TxREFCK/M by N using the MCK frequency division number N on the transmission side acquired by the packet deconstructor 230-4-1, thereby regenerating the audio master clock MCK synchronized with the audio master clock MCK on the transmission side. The above operation is the most important MCK regeneration procedure.

The SCK regenerator 230-4-8 multiplies the cycle of MCK by the reciprocal of K, which is the ratio of the frequency fs frq of the sampling clock, and double the bit width (SDBW) of the SD, thereby regenerating the SCK.

On the other hand, the packet deconstructor 230-4-1 extracts packetized SD (audio serial data) ((9-3) in FIG. 9) from the application packet ((9-1) in FIG. 9), and writes the packetized SD into the FIFO 230-4-2 by a write clock of an appropriate frequency.

The SD written in the FIFO 230-4-2 is read by the SCK and supplied to the I2S encoder 230-4-3.

The I2S encoder 230-4-3 regenerates the I2S signal in FIG. 3 using the information that may be necessary for conversion into the I2S signal supplied from the packet deconstructor 230-4-1, the bit width of the SD, the number of audio channels to be transmitted, and the frequency (fs frq) of the sampling clock together with the SD. The I2S signal including the SCK, the WS signal, and the SD is output to the I2S device 220 connected to the SerDes 230, and the MCK regenerated by the MCK regenerator 230-4-7 is also output to the I2S device 220. The I2S device 220 converts the I2S signal into an analog audio signal in synchronization with the MCK, and finally outputs a sound through the speaker 210.

By the above procedure, the frequency information of the MCK on the transmission side is transmitted to the reception side, and the MCK can be accurately regenerated on the reception side using the PHY clock synchronized between transmission and reception.

As described above, in the first embodiment, the WS signal, the SD, and the SCK conforming to the I2S standard, and the MCK having the frequency obtained by multiplying the frequency of the SCK are received by the SerDes 130, the number of the reference clocks TxREFCK included in the predetermined cycle of the frequency divided signal of the MCK is measured, and a packet including the measured number, the frequency information of the reference clock TxREFCK, the frequency division ratio N of the frequency divided signal to the MCK, and the frequency ratio K of the frequency of the MCK to the frequency fs of the sampling clock is generated and transmitted to the SerDes 230. The SerDes 230 can receive the above-described packet and restore the MCK on the basis of the above-described information included in the packet. Therefore, even in a case where the SerDes 130 and the SerDes 230 transmit and receive packets at timing asynchronous to the I2S signal, the I2S signal can be restored from the packet received by the SerDes 230 and correctly regenerated.

Second Embodiment

In the first embodiment, the I2S device 120 operates asynchronously with the SerDes 130, but the I2S device 120 and the SerDes 130 may operate with clocks synchronized with each other.

Figure 13:
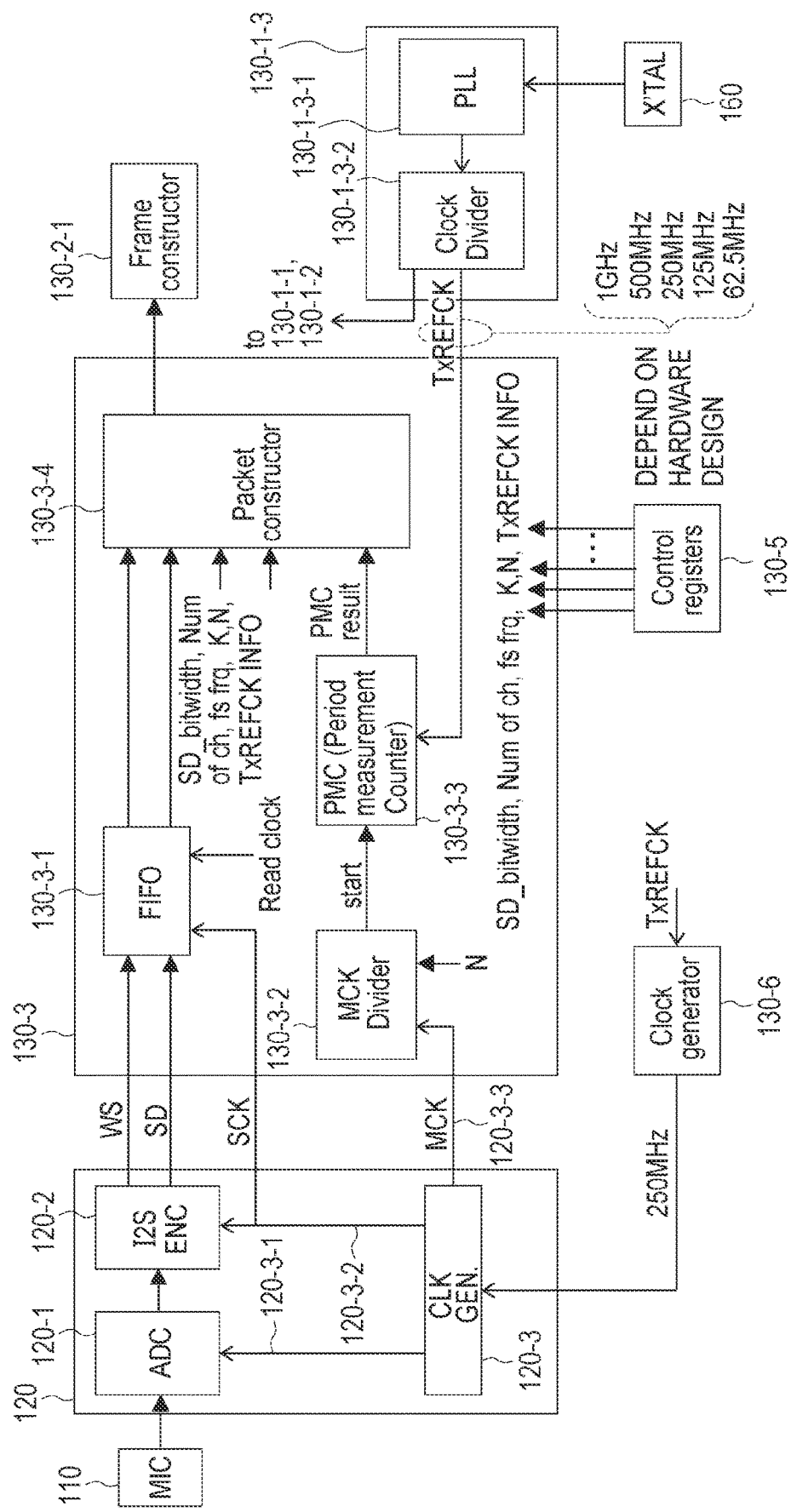
FIG. 13 is a block diagram illustrating internal configurations of an I2S device, and an encapsulator and a PHY clock generator in a SerDes according to a second embodiment.

FIG. 13 is a block diagram illustrating internal configurations of an I2S device 120, and an encapsulator 130-3 and a PHY clock generator 130-1-3 in a SerDes 130 according to a second embodiment. Instead of the X'tal 140 in FIG. 6, a clock generator 130-6 is connected to the I2S device 120 in FIG. 13. The reference clock TxREFCK generated by the PHY unit 130-1 is input to the clock generator 130-6. The clock generator 130-6 generates a reference clock of 250 MHz, for example, in synchronization with the reference clock TxREFCK. The clock generator 120-3 in the I2S device 120 generates, for example, a sampling clock of 50 kHz and an MCK of 25.6 MHz in synchronization with the reference clock of 250 MHz generated by the clock generator 130-6.

The SerDes 130 according to the second embodiment operates similarly to the SerDes 130 according to the first embodiment, but parameters set by the control registers 130-5 are different from each other. FIG. 14 is a diagram illustrating values of parameters used when a SerDes 230 according to the second embodiment regenerates the MCK. In the second embodiment, the TxREFCK and MCK have an integral multiple relationship, N=64, and the PMC result value M=625.

As described above, in the second embodiment, since the I2S device 120 is operated in synchronization with the reference clock TxREFCK generated by the PHY unit 130-1 in the SerDes 130, the frequencies of the audio master clock MCK and TxREFCK can be in an integral multiple relationship. Further, in the second embodiment, the I2S device 120 generates the I2S signal in synchronization with the PHY clock commonly used in respective physical layers of the SerDes 130 on the transmission side and the SerDes 230 on the reception side, so that the X'tal 140 in FIG. 6 may become unnecessary. Furthermore, since the I2S device 120 according to the second embodiment generates the I2S signal at a higher frequency than the first embodiment, jitter characteristics on the regeneration side can be improved.

Third Embodiment

The SerDes 130 and the SerDes 230 may manage information of time stamps synchronized with each other. For example, in a case where the SerDes 130 and the SerDes 230 perform high-speed serial communication in compliance with the ASA standard, a precision time base (PTB) is defined in the ASA standard. The PTB can synchronize time information having a resolution of 4n seconds by exchanging packets serving as time references between the SerDes 130 and the SerDes 230. The time information of the PTB is synchronized with a clock of 250 MHz (hereinafter, the PTB clock), and this clock is used as the TxREFCK. In this case, since the frequency of the TxREFCK is fixed at 250 MHz, it may be unnecessary to transmit the frequency information of the TxREFCK to the reception side. It may be necessary that other information (such as N and K) are included in the header of the application packet and transmitted to the SerDes 230 as in the first exemplary embodiment. Similarly, also in the SerDes 230, the frequency information of the RxREFCK may be unnecessary.

Figure 15:
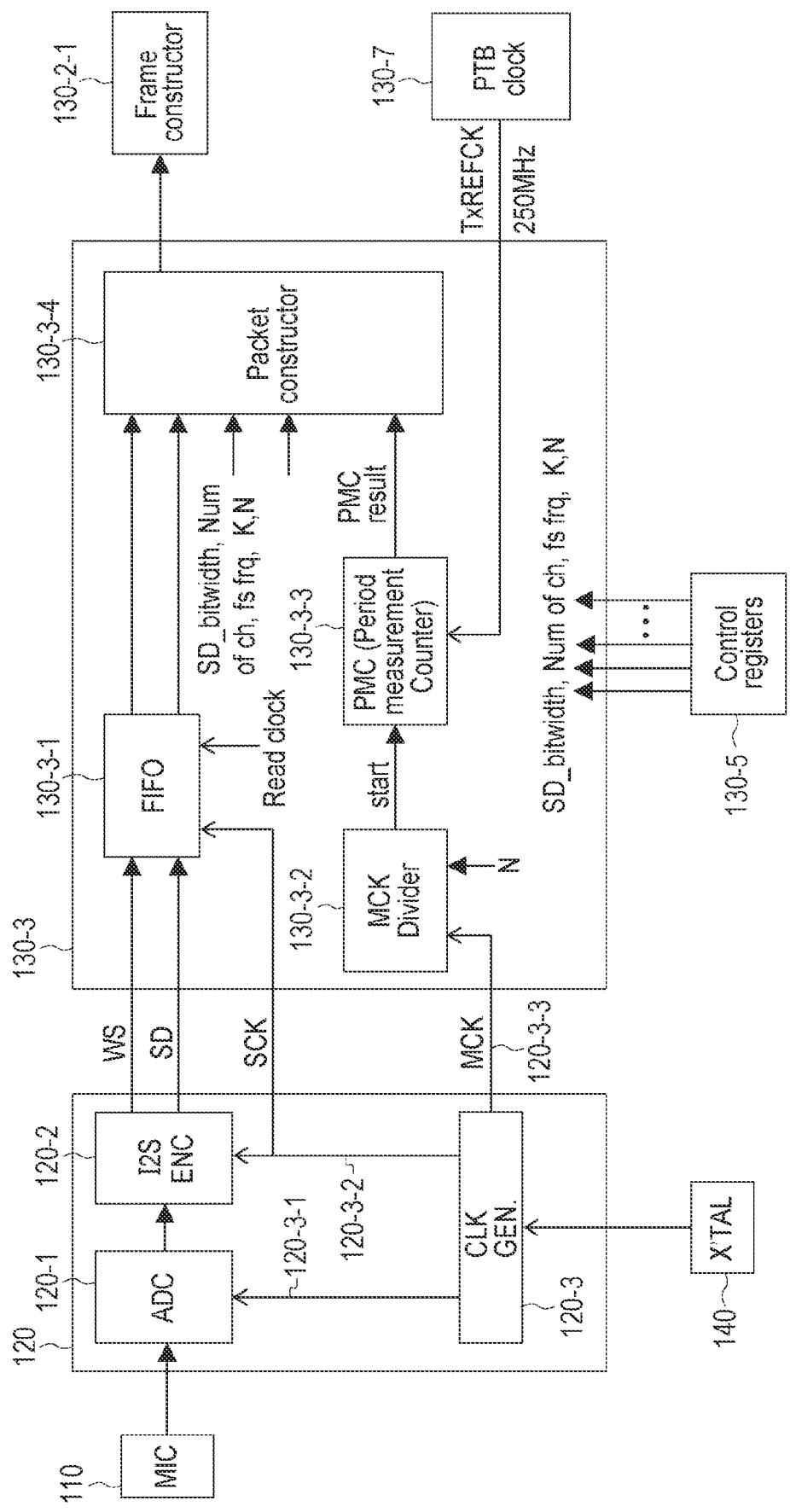
FIG. 15 is a block diagram illustrating an internal configuration of an encapsulator in a SerDes according to a third embodiment.

FIG. 15 is a block diagram illustrating an internal configuration of the encapsulator 130-3 in the SerDes 130 according to a third embodiment. As in FIG. 6, the encapsulator 130-3 in FIG. 15 has the FIFO 130-3-1, the MCK divider 130-3-2, the PMC 130-3-3, and the packet constructor 130-3-4. Instead of inputting the reference clock TxREFCK generated by the PHY clock generator 130-1-3 in FIG. 6, a PTB clock generated by a PTB clock generator 130-7 is input to the encapsulator 130-3 in FIG. 15.

Figure 16:
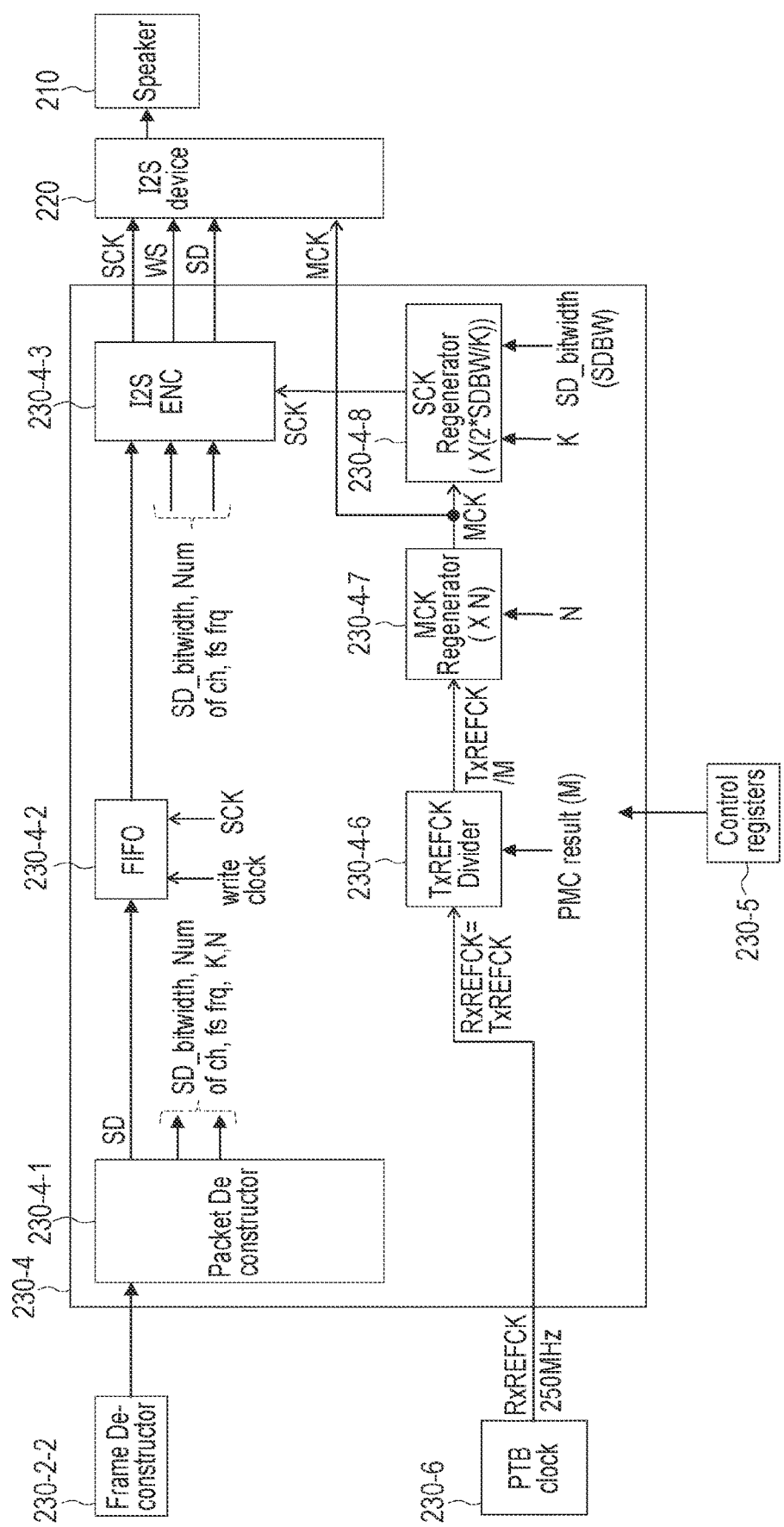
FIG. 16 is a block diagram illustrating an internal configuration of a deencapsulator in a SerDes according to the third embodiment.

FIG. 16 is a block diagram illustrating an internal configuration of the deencapsulator 230-4 in the SerDes 230 according to the third embodiment. Similarly to FIG. 12, the deencapsulator 230-4 in FIG. 16 has the packet deconstructor 230-4-1, the FIFO 230-4-2, the I2S encoder (I2S ENC) 230-4-3, the TxREFCK divider 230-4-6, the MCK regenerator 230-4-7, and the SCK regenerator 230-4-8.

Instead of inputting the reference clock RxREFCK generated by the PHY unit 230-1 in FIG. 12, the PTB clock generated by a PTB clock generator 230-6 is input to the deencapsulator 230-4 in FIG. 16.

The PTB clock generator 130-7 and the PTB clock generator 230-6 generate PTB clocks that synchronize precision time bases (PTB) standardized by the ASA standard. The PTB can synchronize time information having a resolution of 4 nsec by exchanging packets serving as time references between the SerDes 130 and the SerDes 230. The PTB clock of 250 MHz used to generate PTB information is used as the TxREFCK and RxREFCK. In this case, the TxREFCK and RxREFCK are determined as 250 MHz, and the PTB clock having the same frequency is generated on the reception side of transmission and reception, so that it may be unnecessary to transmit TxREFCK INFO to the reception side. Other information and operation are the same as those of the SerDes 130 and the SerDes 230 according to the first embodiment.

As described above, since the PTB clocks used by the SerDes 130 and the SerDes 230 to generate the PTB information used to manage the time stamp information are used as the reference clocks TxREFCK and RxREFCK, it may be unnecessary to transmit the information regarding the TxREFCK from the SerDes 130 to the SerDes 230 to regenerate the TxREFCK in the SerDes 230 in this manner, information transmitted and received between the SerDes 130 and the SerDes 230 can be reduced, and the internal configurations of the SerDes 130 and the SerDes 230 can be simplified.

Fourth Embodiment

In a fourth embodiment, not only the SerDes 130 and the SerDes 230 but also the I2S device 120 uses the PTB clock.

Figure 17:
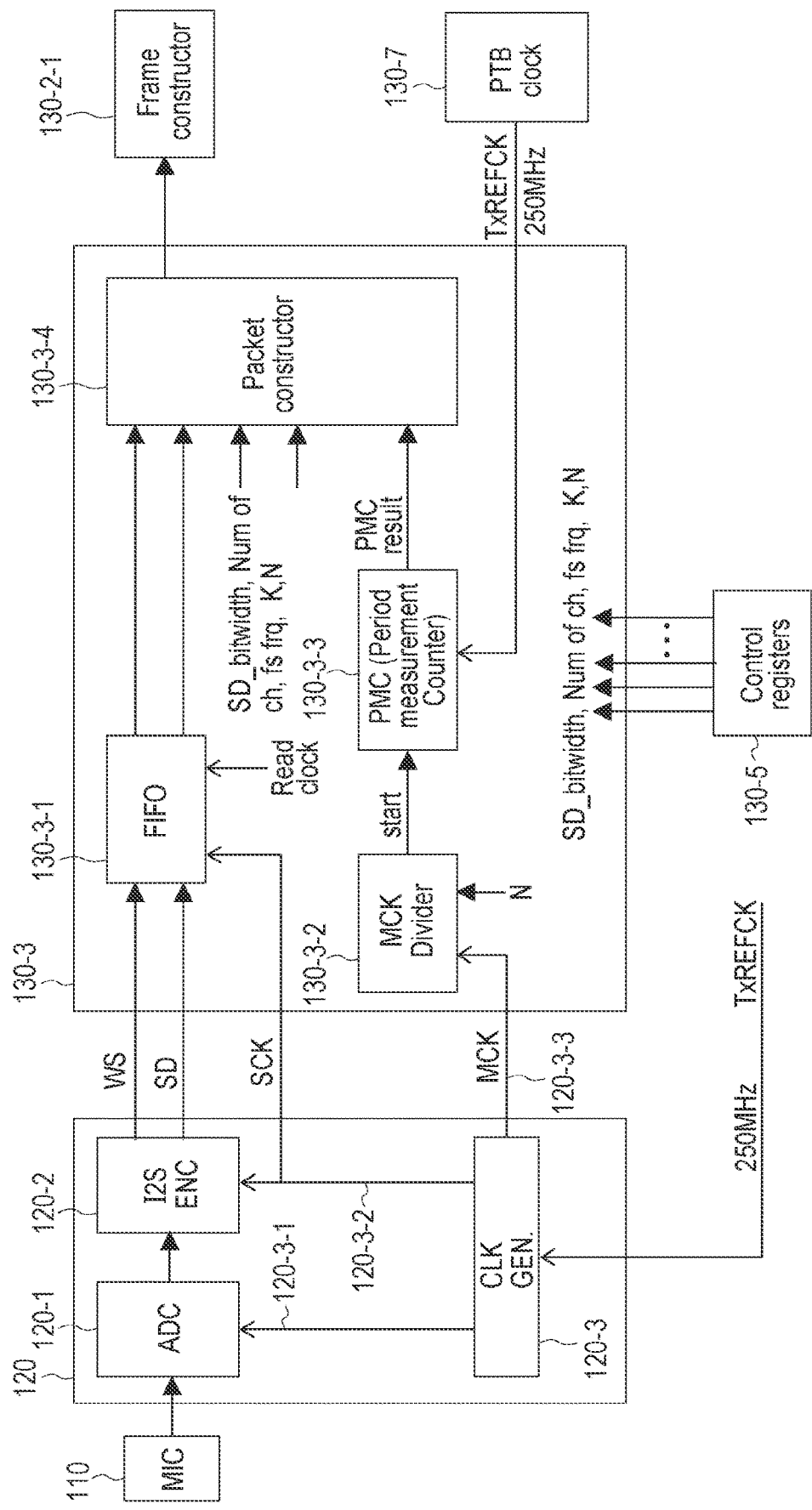
FIG. 17 is a block diagram illustrating internal configurations of an I2S device and an encapsulator in a SerDes according to a fourth embodiment.

FIG. 17 is a block diagram illustrating internal configurations of the I2S device 120 and the encapsulator 130-3 in the SerDes 130 according to the fourth embodiment. Instead of inputting the clock generated by the X'tal 140, the PTB clock of 250 MHz generated by the PTB clock generator 130-7 is input to the I2S device 120. Thus, the I2S signal (SCK, SD, WS signal, MCK) generated by the I2S device 120 can be synchronized with the PTB clock. Furthermore, the X'tal 140 can be omitted.

Fifth Embodiment

A fifth embodiment is characterized in that instead of transmitting the frequency information of the MCK from the SerDes 130 to the SerDes 230, the WS signal indicating the frequency of the sampling clock is transmitted.

Figure 18:
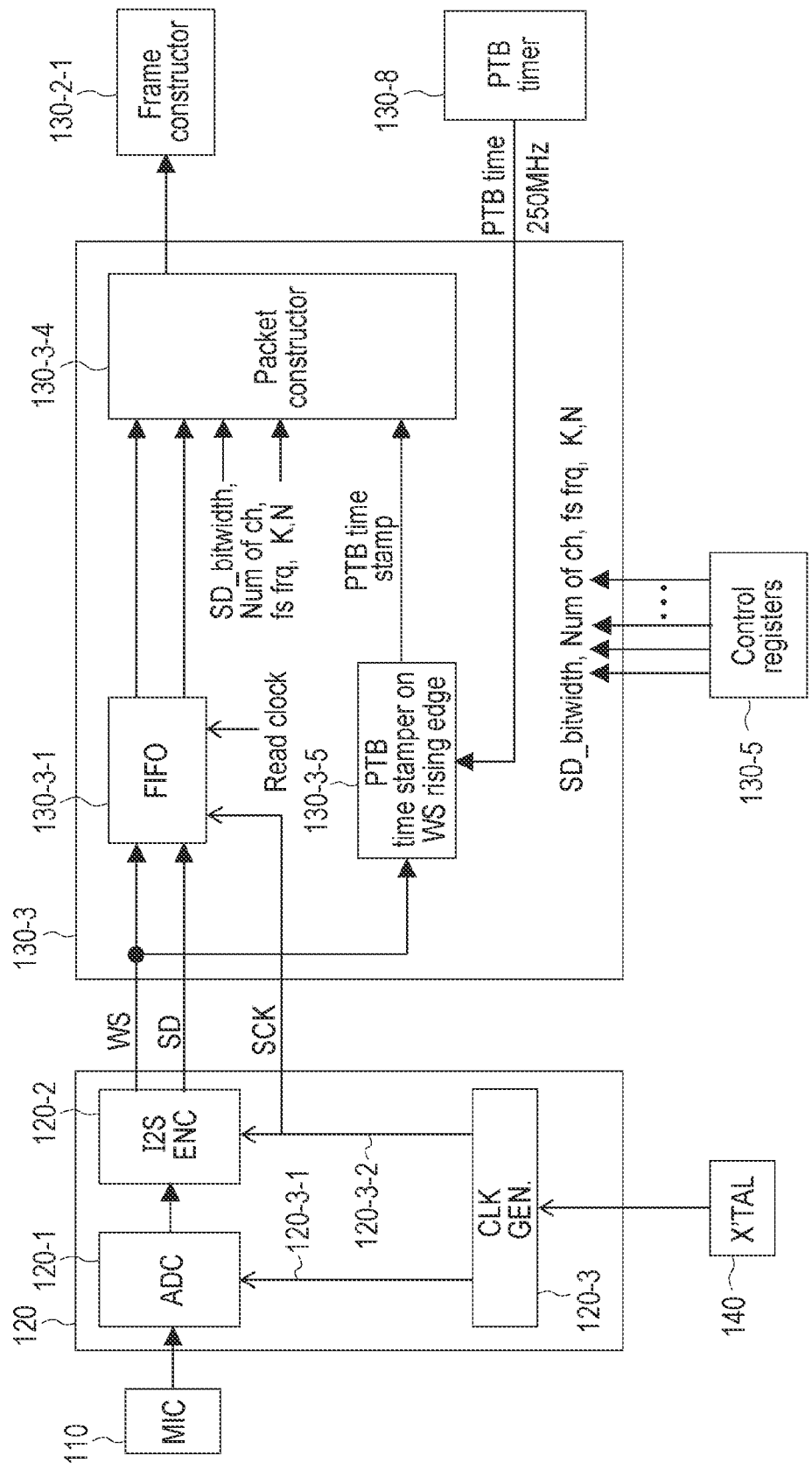
FIG. 18 is a block diagram illustrating internal configurations of an I2S device and an encapsulator in a SerDes according to a fifth embodiment.

FIG. 18 is a block diagram illustrating internal configurations of an I2S device 120 and an encapsulator 130-3 in a SerDes 130 according to the fifth embodiment.

Figure 19:
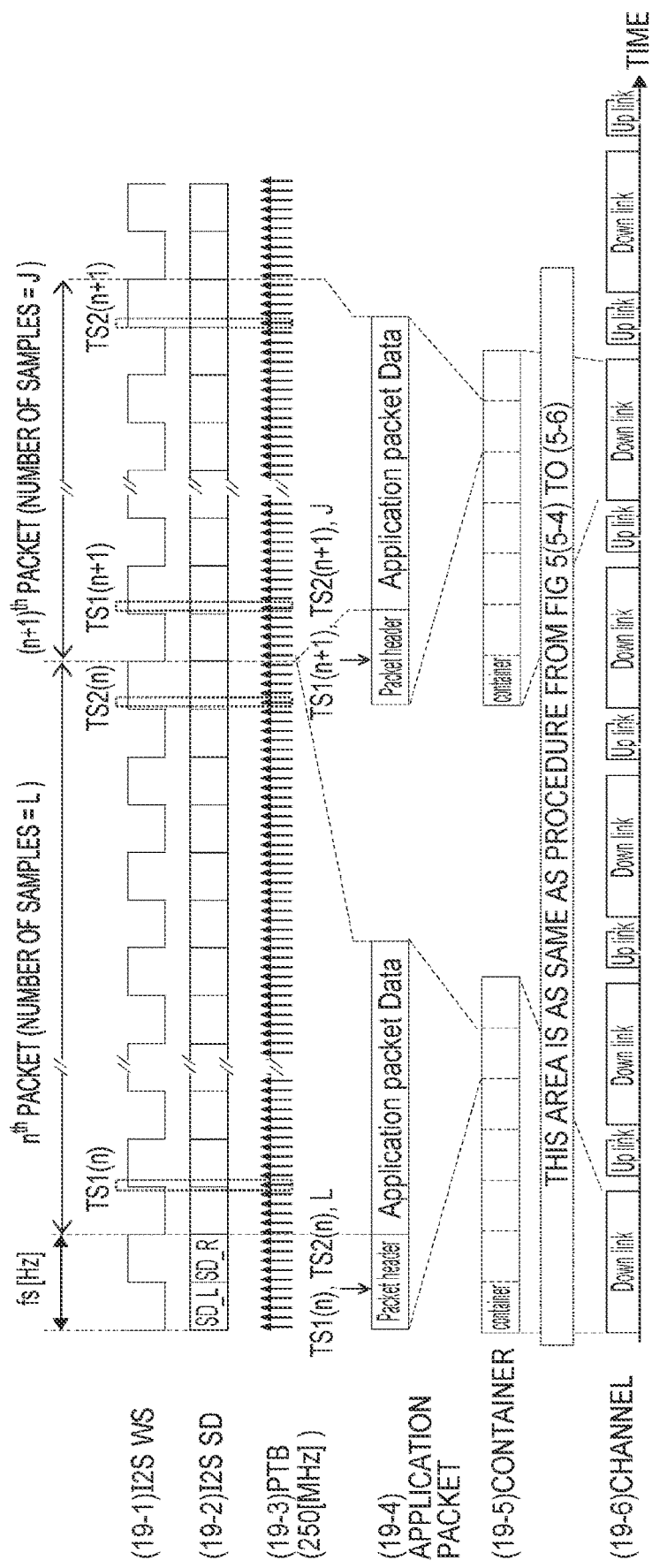
FIG. 19 is a timing chart of a packet transmitted between two SerDes.
Figure 20:
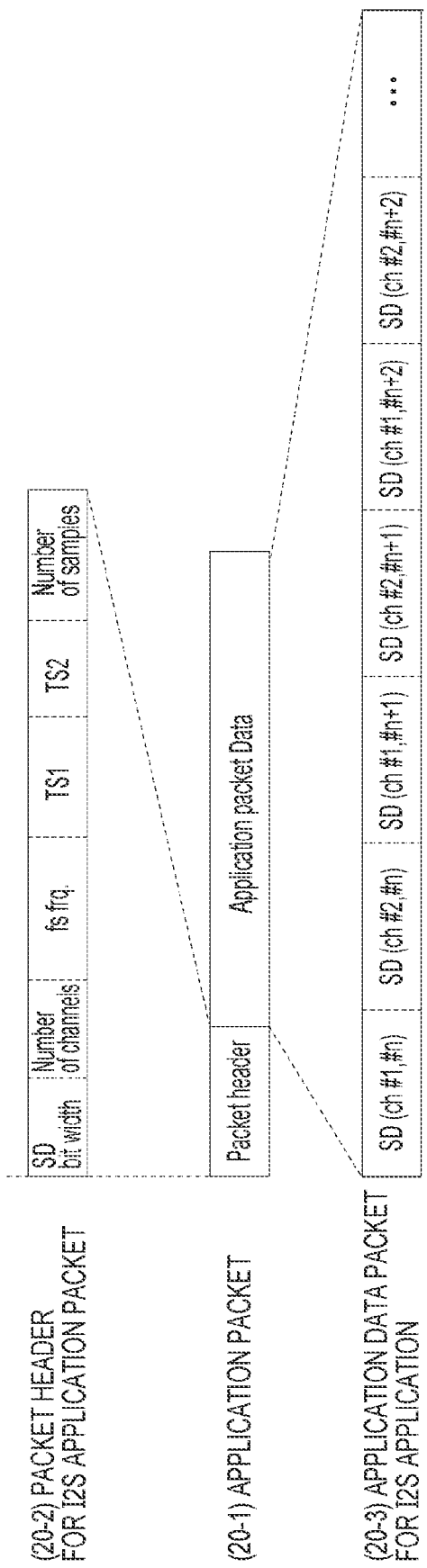
FIG. 20 is a diagram illustrating a configuration of an application packet generated by a SerDes.

FIG. 19 is a timing chart of a packet transmitted between the SerDes 130 and the SerDes 230. FIG. 20 is a diagram illustrating a configuration of an application packet generated by the SerDes 130.

The internal configuration of the I2S device 120 in FIG. 18 is the same as that of FIGS. 6 and 15. The encapsulator 130-3 in the SerDes 130 in FIG. 18 has the FIFO 130-3-1, the packet constructor 130-3-4, and a PTB time stamper 130-3-5. The PTB time stamper 130-3-5 is provided instead of the MCK divider 130-3-2 and the PMC 130-3-3 in FIG. 15. The PTB time stamper 130-3-5 operates in synchronization with the PTB clock.

The PTB time stamper 130-3-5 is supplied with the WS signal indicating the frequency of the sampling clock from the I2S device 120 and the PTB time with a four nsec resolution (250 MHz) supplied from a PTB timer 130-8 are supplied. The PTB time is synchronized with the PTB time on the reception side by PTB synchronization processing standardized in the ASA standard.

The PTB time stamper 130-3-5 samples a rising edge of the input WS, that is, substantially the center of one sample section of I2S data with the PTB time with a four nsec resolution (250 MHz) supplied from the PTB timer 130-8, and supplies the PTB time to the packet constructor 130-3-4.

The packet constructor 130-3-4 obtains SD and WS that are speed-adjusted I2S audio data via the FIFO 130-3-1. The packet constructor 130-3-4 includes the obtained SD in the application packet ((19-2) and 19-4 in FIG. 19) at a timing requested by the frame constructor (130-2-1).

Note that the arrangement of the SD may be the same as (9-3) in FIG. 9. Thus, the number of samples of the SD included in each application packet is not constant but increases or decreases. In the example of FIG. 19, the nth packet includes the SD including L samples, and the (n+1)th packet includes the SD including J samples ((19-2) in FIG. 19).

The packet constructor 130-3-4 includes the number of samples of the SD in the header of each application packet (19-4 in FIG. 19).

Moreover, the packet constructor 130-3-4 includes TS1 and TS2, which are the respective PTB times of a first piece of the SD and a last piece of the SD included in the application packet, in the PTB time of a rising edge of the WS for each SD output from the PTB time stamper 130-3-5, in the packet header (19-4 in FIG. 19).

The packet constructor 130-3-4 further obtains a bit length (bit width of SD) of the SD (I2S audio data) to be transmitted, the number of audio channels to be transmitted, and the frequency (fs frq) of the sampling clock as reference information from the control registers 130-5, and collectively includes these pieces of information, the TS1 and TS2, and the number of samples in the packet header.

As described above, the packet header generated by the packet constructor 130-3-4 has the SD bit width, the number of channels, the frequency fs frq of the sampling clock, the TS1 and TS2, and the number of samples as illustrated in FIG. 20.

The SD bit width is the bit width of the SD (I2S audio serial data) of each channel. The number of channels is the number of audio channels. For example, in a case where the number of channels=2, it means normal stereo.

The fs frq is the frequency of the audio sampling clock, and is, for example, 44.1 kHz or 48 kHz. The TS1 is the timing of a rising edge of the WS in the first piece of the SD among a plurality of pieces of the SD in the packet. The TS2 is the timing of a rising edge of the WS in the last piece of the SD among the plurality of pieces of the SD in the packet. The number of samples is the number of samples of the SD included in one packet.

Furthermore, the application packet following the packet header includes a plurality of pieces of the SD corresponding to the number of samples. Each piece of the SD is serial data specified by a sample number and a channel number. The packet constructor 130-3-4 collectively outputs the packet header and the application packet including the plurality of pieces of SD to the frame constructor 130-2-1 as the application packet (19-4 in FIG. 19).

The frame constructor 130-2-1 adds sync for synchronization to a plurality of application packets to construct a transmission frame, and finally outputs the transmission frame to the channel. Since these processes are the same as those in FIG. 5 ((5-4) to (5-7)), the description thereof will be omitted.

Next, processing on the reception side will be described.

Processing operations of the frame deconstructor in the SerDes 230 are similar to those in the first to fourth embodiments.

Figure 21:
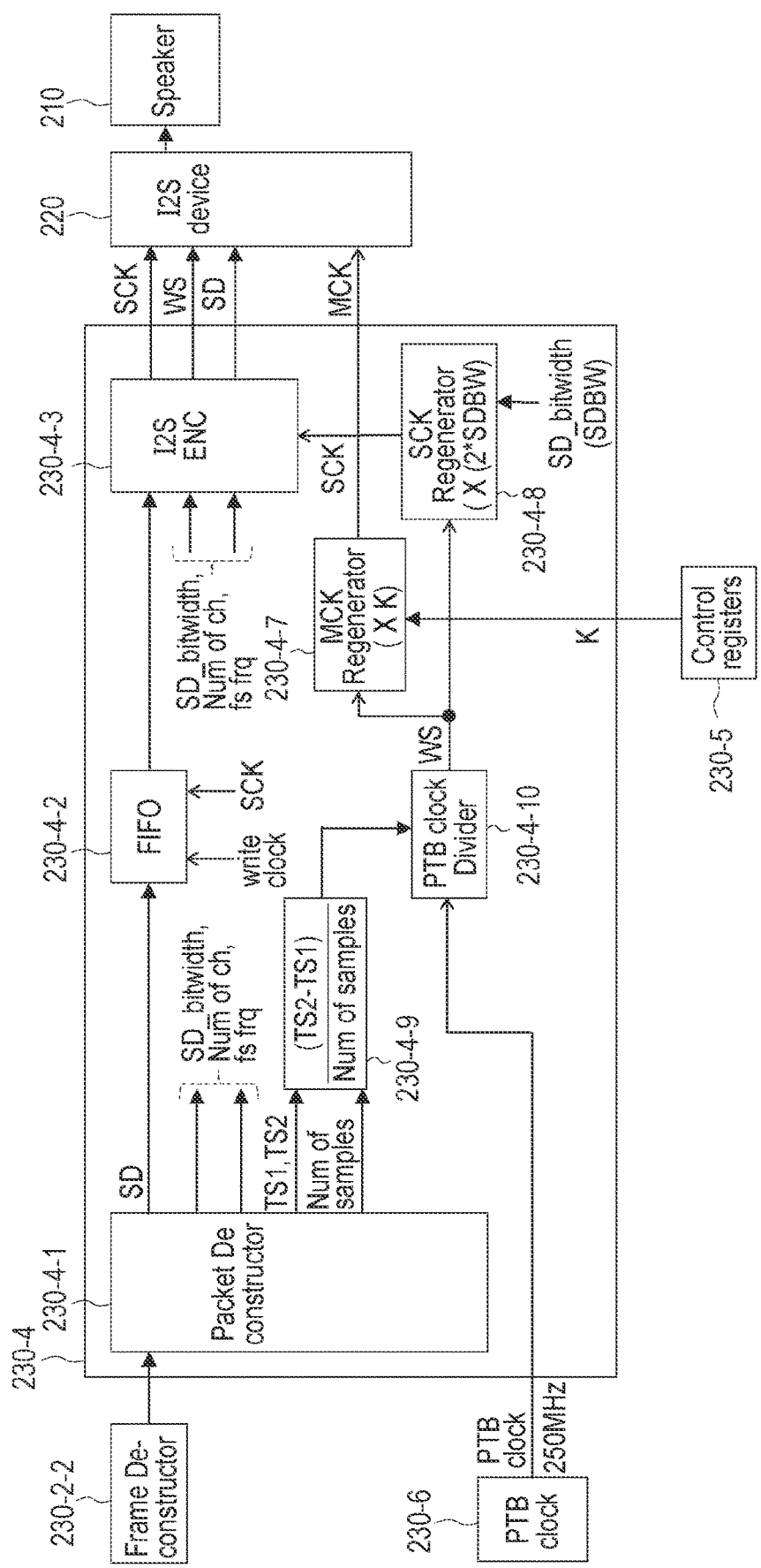
FIG. 21 is a block diagram illustrating an internal configuration of a deencapsulator in a SerDes according to the fifth embodiment.

FIG. 21 is a block diagram illustrating internal configurations of a deencapsulator 230-4 in the SerDes 230 according to the fifth embodiment. The deencapsulator 230-4 in FIG. 21 has the packet deconstructor 230-4-1, the FIFO 230-4-2, the I2S encoder 230-4-3, the MCK regenerator 230-4-7, the SCK regenerator 230-4-8, a WS frequency calculator, and a PTB clock divider.

Processing operations of the packet deconstructor 230-4-1 are similar to those in the first to fourth embodiments.

The packet deconstructor 230-4-1 acquires PTB time stamps TS1 and TS2 representing rising edge positions of the WS of a first piece and a last piece of data of the SD of the number of samples L and the number of samples included in the packet header of the received application packet, and supplies the PTB time stamps TS1 and TS2 and the number of samples to a WS frequency calculator 230-4-9. The WS frequency calculator 230-4-9 calculates (TS2−TS1)/(the number of samples). A calculation result thereof represents an average cycle of the frequency of the audio sampling clock.

Furthermore, by adding and averaging calculation results of (TS2−TS1)/(the number of samples) obtained in each of the plurality of packets, it is possible to obtain a more accurate cycle of the frequency of the sampling clock. The WS frequency calculator 230-4-9 outputs the obtained cycle to a PTB clock divider 230-4-10.

The PTB clock divider 230-4-10 generates the WS signal by dividing a clock of 250 MHz supplied from the PTB clock 230-6 by the value obtained from the WS frequency calculator 230-4-9. The frequency of the WS signal is the same as the frequency of the sampling clock.

The MCK regenerator 230-4-7 uses a constant K obtained from the control registers 230-5 to multiply the WS signal generated by the PTB clock divider 230-4-10 by K, thereby regenerating the audio master clock MCK that may be necessary for the processing in the I2S device 220.

Moreover, the SCK regenerator 230-4-8 regenerates the SCK by setting a cycle obtained by multiplying the cycle of the WS signal by the bit width of the SD and 2 as a cycle of the SCK. In synchronization with the SCK, the SD is read from the FIFO 230-4-2, and the read SD is encoded by the I2S encoder 230-4-3. Processes after the I2S encoder 230-4-3 are similar to that of the SerDes 230 in the first to fourth embodiments, and thus the description thereof is omitted.

FIGS. 22A and 22B are diagrams illustrating a configuration of an application packet for I2S signal transmission generated by the SerDes 130 according to the fifth embodiment in more detail. FIG. 22A illustrates a configuration of the header (I2S header) of the application packet for I2S signal transmission, and FIG. 22B illustrates a configuration of data (I2S data) and CRC of the application packet for I2S signal transmission.

FIG. 22B is the same as FIG. 10B, and thus the description thereof is omitted. The second half of the I2S header in FIG. 22A is different from the I2S header in FIG. 10A. Hereinafter, differences from the I2S header in FIG. 10A will be mainly described.

Bits [7:5] of a first byte and a second byte of the I2S header illustrated in FIG. 22A are the same as those in FIG. 10A. Bits [4:0] of the second byte of the I2S header illustrated in FIG. 22A are reserved. Bits [7:0] of a third byte of the I2S header illustrated in FIG. 22A are TS1 [23:16], bits [7:0] of a fourth byte are TS1 [15:8], and bits [7:0] of a fifth byte are TS1 [7:0]. The TS1 is an integer of 24 bits in the third to fifth bytes, and is the PTB time of a rising edge of the WS signal in the first piece of the SD among the plurality of pieces of the SD in the packet.

Bits [7:0] of a sixth byte of the I2S header illustrated in FIG. 22A are TS2 [23:16], bits [7:0] of a seventh byte are TS2 [15:8], and bits [7:0] of an eighth byte are TS2 [7:0]. The TS2 is an integer of 24 bits in the sixth to eighth bytes, and is PTB time of a rising edge of the WS signal in the last piece of the SD among the plurality of pieces of SD in the packet.

Bits [7:0] of a ninth byte of the I2S header illustrated in FIG. 22A are the number of samples [15:8], and bits [7:0] of a tenth byte are the number of samples [7:0].

These ninth to tenth bytes are 16-bit integers and represent the number of I2S data samples transmitted in this packet.

Note that, among the values included in the packet headers illustrated in FIGS. 9, 10A, 20, and 22A described above, setting information that, once set, may be unnecessary to be transmitted for each packet transmission, such as the bit width of the SD (I2S audio data) to be transmitted, the number of audio channels to be transmitted, the frequency (fs frq) of the sampling clock, the multiplication number K of the sampling clock (frequency fmck=K×fs frq of MCK), the MCK frequency division number N, and the reference clock frequency information (TxREFCK INFO), may be transmitted from the transmission side to the reception side using an OAM channel or other information transmission means, in addition to being included in the packet header.

Moreover, the application packets ((9-1) in FIG. 9 and (20-1) in FIG. 20) for transmitting the I2S signal illustrated in FIGS. 9 and 20 described above may not only be transmitted as one independent application, but also be arranged in an application packet for transmitting video data and transmitted as illustrated in FIG. 23, for example. In the example of FIG. 23, a plurality of pieces of video data is included in the application packet, and the I2S audio data is included among the plurality of pieces of video data.

As described above, in the fifth embodiment, since the timing TS1 of the rising edge of the WS signal in the first piece of the SD, the timing TS2 of the rising edge of the WS signal in the last piece of the SD, and the number of samples of the SD among the plurality of pieces of SD in the application packet are included in the packet header, the average cycle of the frequency of the sampling clock can be calculated, and the WS signal can be generated on the basis of the calculation result.

Thus, according to the fifth embodiment, as in the first to fourth embodiments, it may be unnecessary to transmit MCK from the SerDes 130 on the transmission side to the SerDes 230 on the reception side and count the number of reference clocks TxREFCK included in the frequency divided signal of MCK in the SerDes 230, and the configuration in the SerDes 230 can be simplified.

It should be understood by those skilled in the art that various modifications, combinations, sub-combinations and alterations may occur depending on design requirements and other factors insofar as they are within the scope of the appended claims or the equivalents thereof.

Note that the present technology can have configurations as follows.

(1) A communication device including:

a measurement unit that measures a number of the predetermined reference clocks included in one cycle of the frequency divided signal, on the basis of an audio master clock having a frequency obtained by multiplying a frequency of a sampling clock to sample an audio signal, a frequency division ratio of a frequency divided signal of the audio master clock, and a predetermined reference clock; and a packet generator that generates a packet including information including the number measured by the measurement unit, a bit width of serial data (SD) conforming to an Inter-IC Sound (I2S) standard, the frequency of the sampling clock, a frequency division ratio of the frequency divided signal to the audio master clock, a frequency ratio of the frequency of the audio master clock to the frequency of the sampling clock, and the SD.

(2) The communication device according to (1), in which the packet generated by the packet generator includes a header section and a data section, and the header section includes the number measured by the measurement unit, the bit width of the SD, the frequency of the sampling clock, the frequency division ratio, and the frequency ratio, and the data section includes a plurality of pieces of the SD.

(3) The communication device according to (2), in which the header section includes the bit width of the SD, a number of channels of the SD, the frequency of the sampling clock, the frequency division ratio of the frequency divided signal to the audio master clock, the frequency ratio of the frequency of the audio master clock to the frequency of the sampling clock, the frequency of the reference clock, and the number measured by the measurement unit.

(4) The communication device according to (3), in which the data section includes pieces of the SD corresponding to the number of channels and a number of samples.

(5) The communication device according to any one of (1) to (4), further including:

a physical layer clock generator that generates a clock commonly used in physical layers of both the communication device and the communication partner device; and a divider that divides the clock generated by the physical layer clock generator to generate the reference clock.

(6) The communication device according to (5), in which a frequency of the clock generated by the physical layer clock generator is 250 megahertz (MHz).

(7) The communication device according to (6), in which the frequency of the audio master clock is 25.6 MHz, and the frequency of the sampling clock is 50 kilohertz (kHz).

(8) The communication device according to any one of (1) to (7), in which the sampling clock and the audio master clock are asynchronous with the reference clock.

(9) The communication device according to any one of (1) to (7), in which the sampling clock and the audio master clock are synchronized with the reference clock.

(10) The communication device according to any one of (1) to (4), further including a precision time base (PTB) clock generator that generates a PTB clock used to generate time stamp information used in common with a communication partner device, in which the reference clock is the PTB clock.

(11) The communication device according to (10), in which the audio master clock is synchronized with the PTB clock.

(12) The communication device according to (10) or (11), in which a frequency of the PTB clock is 250 MHz.

(13) A communication device including:

a measurement unit that receives a word select (WS) signal conforming to an Inter-IC Sound (I2S) standard, and that measures first timing information indicating a timing of a logical change of the WS signal in a first piece of serial data (SD) among a plurality of pieces of the SD included in one packet transmitted to a communication partner device, and second timing information indicating a timing of a logical change of the WS signal in a last piece of the SD among the plurality of pieces of the SD, on the basis of a predetermined reference clock used in common with the communication partner device; and a packet generator that generates the packet including a bit width of the SD, a frequency of a sampling clock to sample an audio signal, the first timing information, the second timing information, a number of pieces of the SD included in the one packet, and the SD.

(14) The communication device according to (13), in which the packet generator generates the packet further including information on a number of channels of the SD.

(15) A communication device including:

a restoration unit that receives a packet transmitted from a communication partner device and restores, from the packet, serial data (SD) conforming to an Inter-IC Sound (I2S) standard, a bit width of the SD, a frequency of a sampling clock to sample an audio signal, a frequency ratio of a frequency of an audio master clock to the frequency of the sampling clock, a number of predetermined first reference clocks included in one cycle of a frequency divided signal of the audio master clock, the frequency of the sampling clock, and a frequency division ratio of the frequency divided signal to the audio master clock;

an audio master clock regenerator that regenerates the audio master clock on the basis of a number of the first reference clocks, a frequency of the first reference clock, and the frequency division ratio; and a serial clock (SCK) regenerator that regenerates an SCK on the basis of bit width information of the SD, the frequency ratio, and the audio master clock.

(16) The communication device according to (15), further including:

a clock regeneration circuit that generates a second reference clock synchronized with a signal change of the SD on the basis of the packet; and a frequency ratio calculator that calculates a frequency ratio between a frequency of the first reference clock and a frequency of the second reference clock, in which the audio master clock regenerator regenerates the audio master clock on the basis of the number of the first reference clocks, frequency information of the first reference clock, the frequency division ratio, and the frequency ratio calculated by the frequency ratio calculator.

(17) The communication device according to (15) or (16), further including a precision time base (PTB) clock generator that generates a PTB clock used to generate time stamp information used in common with the communication partner device, in which the first reference clock is the PTB clock.

(18) A communication device including:

a restoration unit that receives packets transmitted from a communication partner device and restores, from the packets, serial data (SD) conforming to an Inter-IC Sound (I2S) standard, bit width information of the SD, frequency information of serial clock (SCK), first timing information indicating a timing when a word select (WS) signal first changes logically from the WS signal included in one of the packets, second timing information indicating a timing when the WS signal last changes logically from the WS signal included in one of the packets, and a number of pieces of the SD included in one of the packets;

a clock generator that generates a reference clock used in common with the communication partner device;

a WS signal regenerator that regenerates the WS signal on the basis of the first timing information, the second timing information, the number of pieces of the SD, and the reference clock;

an audio master clock regenerator that multiplies a frequency of the WS signal regenerated by the WS signal regenerator and regenerates an audio master clock; and an SCK regenerator that regenerates the SCK on the basis of the WS signal regenerated by the WS signal regenerator and the bit width information of the SD.

(19) The communication device according to (14) or (18), further including a precision time base (PTB) clock generator that generates a PTB clock used to generate time stamp information used in common with a communication partner device, in which the reference clock is the PTB clock.

(20) The communication device according to any one of (1) to (19), in which the packet is transmitted within a period allocated by time division duplex (TDD).

(21) A communication system including:

a first communication device; and a second communication device that performs serial communication with the first communication device, in which the first communication device includes a measurement unit that measures, on the basis of an audio master clock having a frequency obtained by multiplying a frequency of a sampling clock to sample an audio signal, a frequency division ratio of a frequency divided signal of the audio master clock, and a predetermined reference clock, a number of the predetermined reference clocks included in one cycle of the frequency divided signal, and a packet generator that generates a packet including information including the number measured by the measurement unit, a bit width of serial data (SD) conforming to an Inter-IC Sound (I2S) standard, the frequency of the sampling clock, a frequency division ratio to the audio master clock of the frequency divided signal, a frequency ratio of the frequency of the audio master clock to the frequency of the sampling clock, and the SD, and the second communication device includes a restoration unit that receives a packet transmitted from the first communication device and restores, from the packet, the SD, a bit width of the SD, the frequency of the sampling clock, a frequency ratio of a frequency of the audio master clock to the frequency of the sampling clock, a number of predetermined first reference clocks included in one cycle of a frequency-divided signal of the audio master clock, the frequency of the sampling clock, and a frequency division ratio of the frequency divided signal to the audio master clock, an audio master clock regenerator that regenerates the audio master clock on the basis of the number of first reference clocks, a frequency of the first reference clock, and the frequency division ratio, and an SCK regenerator that regenerates a serial clock (SCK) on the basis of bit width information of the SD, the frequency ratio, and the audio master clock.

(22) A communication system including:
a first communication device; and
a second communication device that performs serial communication with the first communication device, in which the first communication device includes a measurement unit that receives a word select (WS) signal conforming to an Inter-IC Sound (I2S) standard, and that measures first timing information indicating a timing of a logical change of the WS signal in a first piece of serial data (SD) among a plurality of pieces of the SD included in one packet transmitted to the second communication device and second timing information indicating a timing of a logical change of the WS signal in a last piece of the SD among the plurality of pieces of the SD, on the basis of a predetermined reference clock used in common with the second communication device, and a packet generator that generates the packet including a bit width of the SD, a frequency of a sampling clock to sample an audio signal, the first timing information, the second timing information, a number of pieces of the SD included in the one packet, and the SD, the second communication device includes
a restoration unit that receives packets transmitted from the second communication device and restores, from the packets, serial data (SD) conforming to the I2S standard, bit width information of the SD, frequency information of serial clock (SCK), first timing information indicating a timing when a word select (WS) signal first changes logically from the WS signal included in one of the packets, second timing information indicating a timing when the WS signal last changes logically from the WS signal included in one of the packets, and a number of pieces of the SD included in one of the packets, a clock generator that generates a reference clock used in common with the first communication device, a WS signal regenerator that regenerates the WS signal on the basis of the first timing information, the second timing information, the number of pieces of the SD, and the reference clock, an audio master clock regenerator that multiplies a frequency of the WS signal regenerated by the WS signal regenerator and regenerates an audio master clock, and an SCK regenerator that regenerates the SCK on the basis of the WS signal regenerated by the WS signal regenerator and the bit width information of the SD.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents defined in the claims and equivalents thereof.

REFERENCE SIGNS LIST

1 Communication system
10 First communication module
20 Second communication module
100 First communication module
110 Microphone (hereinafter, a mic)
120 First I2S device
120-2 I2S encoder
120-3 Clock generator
130 SerDes
130-1 PHY unit
130-1-1 Link transmitter
130-1-2 Link receiver
130-1-3 PHY clock generator
130-1-3-1 PLL circuit
130-1-3-2 Clock divider
130-2 Link unit
130-2-1 Frame constructor
130-2-2 Frame deconstructor
130-2-3 OAM unit
130-3 Encapsulator
130-3-2 MCK divider
130-3-4 Packet constructor
130-3-5 PTB time stamper
130-4 Deencapsulator
130-5 Control register
130-6 Clock generator
130-7 PTB clock generator
130-8 PTB timer
130 SerDes
150 Camera
200 Second communication module
210 Speaker
220 I2S device
220-1 I2S decoder
220-3 Clock divider
230 SerDes
230-1 PHY unit
230-1-1 Link transmitter
230-1-2 Link receiver
230-1-4 Clock divider
230-2 Link unit
230-2-2 Frame deconstructor
230-2-3 OAM unit
230-3 Encapsulator
230-4-3 I2S encoder
230-4 Deencapsulator
230-4-1 Packet deconstructor
230-4-10 PTB clock divider
230-4-3 I2S encoder
230-4-4 RFECK ratio calculator
230-4-5 TxREFCK regenerator
230-4-6 TxREFCK divider
230-4-7 MCK regenerator
230-4-7 Regenerator
230-4-8 SCK regenerator
230-4-8 Regenerator
230-4-9 WS frequency calculator
230-5 Control register
230-6 PTB clock generator
230-6 Clock
250 Video decoder
250 MHz Resolution
260 ADAS/ADS Processor
300 Transmission cable

The invention claimed is:
1. A communication device comprising:
a measurement unit that measures a number of clocks of a predetermined reference clock included in one cycle of a frequency divided signal of an audio master clock having a frequency obtained by multiplying a frequency of a sampling clock to sample an audio signal, on a basis of the audio master clock, a frequency division ratio of a frequency divided signal of the audio master clock, and the predetermined reference clock; and a packet generator that generates a packet including information including the number measured by the measurement unit, a bit width of serial data (SD) conforming to an Inter-IC Sound (I2S) standard, the frequency of the sampling clock, a frequency division ratio of the frequency divided signal to the audio master clock, a frequency ratio of the frequency of the audio master clock to the frequency of the sampling clock, and the SD.

2. The communication device according to claim 1, wherein
the packet generated by the packet generator includes a header section and a data section, and
the header section includes the number measured by the measurement unit, the bit width of the SD, the frequency of the sampling clock, the frequency division ratio, and the frequency ratio, and
the data section includes a plurality of pieces of the SD.

3. The communication device according to claim 2, wherein the header section includes the bit width of the SD, a number of channels of the SD, the frequency of the sampling clock, the frequency division ratio of the frequency divided signal to the audio master clock, the frequency ratio of the frequency of the audio master clock to the frequency of the sampling clock, the frequency of the reference clock, and the number measured by the measurement unit.

4. The communication device according to claim 3, wherein the data section includes pieces of the SD corresponding to the number of channels and a number of samples.

5. The communication device according to claim 1, further comprising:
a physical layer clock generator that generates a clock commonly used in physical layers of both the communication device and the communication partner device; and
a divider that divides the clock generated by the physical layer clock generator to generate the reference clock.

6. The communication device according to claim 5, wherein a frequency of the clock generated by the physical layer clock generator is 250 megahertz (MHz).

7. The communication device according to claim 6, wherein
the frequency of the audio master clock is 25.6 MHz, and
the frequency of the sampling clock is 50 kilohertz (kHz).

8. The communication device according to claim 1, wherein the sampling clock and the audio master clock are asynchronous with the reference clock.

9. The communication device according to claim 1, wherein the sampling clock and the audio master clock are synchronized with the reference clock.

10. The communication device according to claim 1, further comprising
a precision time base (PTB) clock generator that generates a PTB clock used to generate time stamp information used in common with a communication partner device, wherein the reference clock is the PTB clock.

11. The communication device according to claim 10, wherein the audio master clock is synchronized with the PTB clock.

12. The communication device according to claim 10, wherein a frequency of the PTB clock is 250 MHz.

13. A communication device comprising:
a restoration unit that receives a packet transmitted from a communication partner device and restores, from the packet, serial data (SD) conforming to an Inter-IC Sound (I2S) standard, a bit width of the SD, a frequency of a sampling clock to sample an audio signal, a frequency ratio of a frequency of an audio master clock to the frequency of the sampling clock, a number of clocks of a first reference clock included in one cycle of a frequency divided signal of the audio master clock, the frequency of the sampling clock, and a frequency division ratio of the frequency divided signal to the audio master clock;
an audio master clock regenerator that regenerates the audio master clock on a basis of the number of clocks of the first reference clock, a frequency of the first reference clock, and the frequency division ratio; and
a serial clock (SCK) regenerator that regenerates an SCK on a basis of bit width information of the SD, the frequency ratio, and the audio master clock.

14. The communication device according to claim 13, further comprising:
a clock regeneration circuit that generates a second reference clock synchronized with a signal change of the SD on a basis of the packet; and
a frequency ratio calculator that calculates a frequency ratio between a frequency of the first reference clock and a frequency of the second reference clock,
wherein the audio master clock regenerator regenerates the audio master clock on a basis of the number of the first reference clocks, frequency information of the first reference clock, the frequency division ratio, and the frequency ratio calculated by the frequency ratio calculator.

15. The communication device according to claim 13, further comprising
a precision time base (PTB) clock generator that generates a PTB clock used to generate time stamp information used in common with the communication partner device,
wherein the first reference clock is the PTB clock.

16. The communication device according to claim 1, wherein the packet is transmitted within a period allocated by time division duplex (TDD).

17. A communication system comprising:
a first communication device; and
a second communication device that performs serial communication with the first communication device,
wherein the first communication device includes
a measurement unit that measures a number of clocks of a predetermined reference clock included in one cycle of a frequency divided signal of an audio master clock having a frequency obtained by multiplying a frequency of a sampling clock to sample an audio signal, on a basis of the audio master clock, a frequency division ratio of a frequency divided signal of the audio master clock, and the predetermined reference clock, and a packet generator that generates a packet including information including the number measured by the measurement unit, a bit width of serial data (SD) conforming to an Inter-IC Sound (I2S) standard, the frequency of the sampling clock, a frequency division ratio to the audio master clock of the frequency divided signal, a frequency ratio of the frequency of the audio master clock to the frequency of the sampling clock, and the SD, and the second communication device includes a restoration unit that receives a packet transmitted from the first communication device and restores, from the packet, the SD, a bit width of the SD, the frequency of the sampling clock, the frequency ratio of the frequency of the audio master clock to the frequency of the sampling clock, a number of clocks of a first reference clock included in one cycle of the frequency divided signal of the audio master clock, the frequency of the sampling clock, and a frequency division ratio of the frequency divided signal to the audio master clock, an audio master clock regenerator that regenerates the audio master clock on a basis of the number of clocks of the first reference clock, a frequency of the first reference clock, and the frequency division ratio, and an SCK regenerator that regenerates a serial clock (SCK) on a basis of bit width information of the SD, the frequency ratio, and the audio master clock.

\* \* \* \* \*